United States Patent
Kasahara et al.

(10) Patent No.: US 10,178,799 B2
(45) Date of Patent: Jan. 8, 2019

(54) SUPERCONDUCTING FAULT CURRENT LIMITER AND COOLING METHOD FOR SUPERCONDUCTING ELEMENT WITHIN SUPERCONDUCTING FAULT CURRENT LIMITER

(71) Applicant: FURUKAWA ELECTRIC CO., LTD., Chiyoda-ku, Tokyo (JP)

(72) Inventors: Hajime Kasahara, Tokyo (JP); Tomohiro Nakayama, Tokyo (JP); Masakazu Matsui, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 575 days.

(21) Appl. No.: 14/767,878

(22) PCT Filed: Feb. 7, 2014

(86) PCT No.: PCT/JP2014/052855
§ 371 (c)(1),
(2) Date: Aug. 13, 2015

(87) PCT Pub. No.: WO2014/126006
PCT Pub. Date: Aug. 21, 2014

(65) Prior Publication Data
US 2015/0382505 A1 Dec. 31, 2015

(30) Foreign Application Priority Data

Feb. 13, 2013 (JP) .................................. 2013-025068
Feb. 13, 2013 (JP) .................................. 2013-025069

(51) Int. Cl.
*H05K 7/20* (2006.01)
*H02H 9/02* (2006.01)
(Continued)

(52) U.S. Cl.
CPC ......... *H05K 7/20236* (2013.01); *H01L 39/16* (2013.01); *H02H 7/001* (2013.01); *H02H 9/023* (2013.01); *Y02E 40/68* (2013.01)

(58) Field of Classification Search
CPC ........ H02H 7/001; H02H 9/023; H01L 39/16; H05K 7/20236; Y02E 40/68
(Continued)

(56) References Cited

U.S. PATENT DOCUMENTS 7,760,067 B2 7/2010 Prusseit et al.
2005/0068701 A1 3/2005 Lee et al.
(Continued)

FOREIGN PATENT DOCUMENTS

JP S62-085449 A 4/1987
JP S63-299181 A 12/1988
(Continued)

OTHER PUBLICATIONS

Japanese Office Action dated May 24, 2016 for Japanese Patent Application No. 2014-022117, 7 pages (with translation).
(Continued)

*Primary Examiner* — Kevin J Comber
(74) *Attorney, Agent, or Firm* — Amin, Turocy & Watson, LLP

(57) ABSTRACT

A superconducting fault current limiter (10) is provided with superconducting elements (71, 72) that are in a superconducting state during electrification with a current value in a fixed range and in a normal conducting state during electrification with a fault current in which the current value exceeds the fixed range and is further provided with a coolant vessel (20), which accommodates a liquid coolant (60) and a plurality of superconducting elements, and a cooling means (40) that cools the liquid coolant within the coolant vessel. Within the liquid coolant, the superconduct-
(Continued)

ing element (71) for which the critical current is smallest among the plurality of superconducting elements is disposed on the upper side of any other superconducting elements (72). Thus, the superconducting element (71) is cooled, and the life of the superconducting fault current limiter as a whole is extended.

18 Claims, 17 Drawing Sheets

(51) Int. Cl.
  *H01L 39/16* (2006.01)
  *H02H 7/00* (2006.01)
(58) Field of Classification Search
  USPC .................................................. 361/93.9
  See application file for complete search history.

(56) References Cited

U.S. PATENT DOCUMENTS

| | | |
|---|---|---|
| 2005/0153843 A1 | 7/2005 | Kubota |
| 2006/0122067 A1 | 6/2006 | Holcomb |
| 2007/0205857 A1* | 9/2007 | Prusseit ............... H01L 39/16 338/13 |

FOREIGN PATENT DOCUMENTS

| | | |
|---|---|---|
| JP | H02-269413 A | 11/1990 |
| JP | H04-023457 A | 1/1992 |
| JP | H06-104358 A | 4/1994 |
| JP | H09-252527 A | 9/1997 |
| JP | H09252527 A | 9/1997 |
| JP | 2000-069663 A | 3/2000 |
| JP | 2005-109511 A | 4/2005 |
| JP | 2007-294922 A | 11/2007 |
| JP | 2007-317884 A | 12/2007 |
| JP | 2012-146821 A | 8/2012 |
| JP | 2013-038333 A | 2/2013 |

OTHER PUBLICATIONS

Extended European Search Report for European Application No. 14751627.2 dated Sep. 9, 2016, 8 pages.
International Search Report for International Application No. PCT/JP2014/052855 dated Apr. 28, 2014, 4 pages.
International Preliminary Report on Patentability for International Application No. PCT/JP2014/052855 dated Aug. 18, 2015, 19 pages.

* cited by examiner

FIG.2

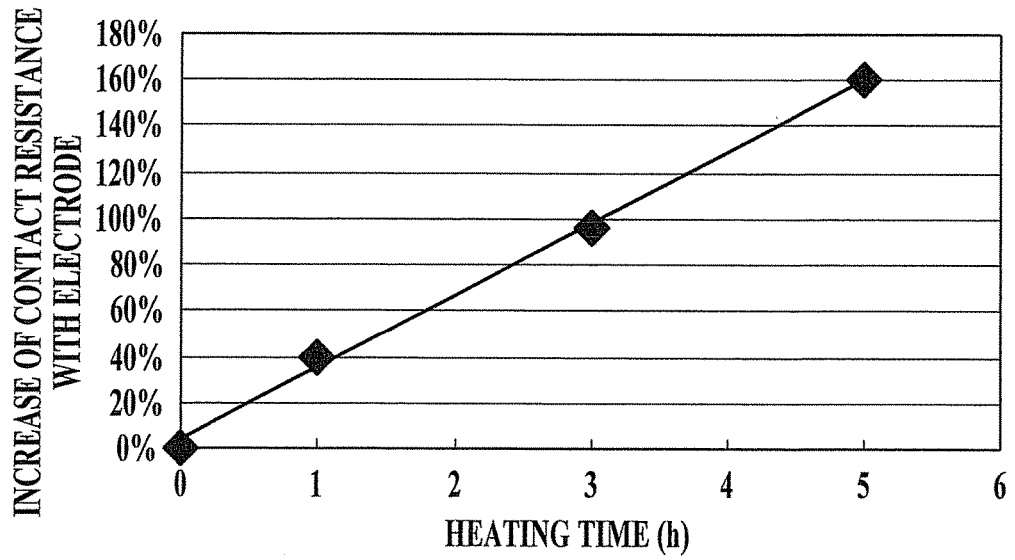

FIG.3

| | Ic(A) | GENERATED HEAT (kJ) | TEMPERATURE (°C) | COOLING TIME (s) | DURABLE NUMBER OF CURRENT LIMITING OPERATIONS |
|---|---|---|---|---|---|
| ELEMENT WITH HIGH CRITICAL CURRENT | 120 | 3 | 60 | 12 | 2700 |
| ELEMENT WITH LOW CRITICAL CURRENT | 100 | 4 | 100 | 15 | 700 |

FIG.4

| | IC (A) OF UPPER ELEMENT | IC (A) OF LOWER ELEMENT | UPPER ELEMENT LIFE (NUMBER OF CURRENT LIMITING OPERATIONS) | LOWER ELEMENT LIFE (NUMBER OF CURRENT LIMITING OPERATIONS) | DEVICE LIFE (NUMBER OF CURRENT LIMITING OPERATIONS) |
|---|---|---|---|---|---|
| EXAMPLE 1 | 100 | 120 | 800 | 2700 | 800 |
| COMPARISON 1 | 120 | 100 | 3100 | 700 | 700 |

FIG.7

| ELEMENT LOCATION | Ic(A) | LIFE IN PRESENT ARRANGEMENT | LIFE AS SOLE ELEMENT |
|---|---|---|---|
| A(81) | 90 | 800 | 700 |
| B(82) | 95 | 1200 | 1000 |
| C(83) | 100 | 1600 | 1400 |
| D(84) | 105 | 2000 | 1700 |
| E(85) | 110 | 2300 | 2000 |
| F(86) | 115 | 2700 | 2400 |
| G(87) | 115 | 2400 | 2400 |
| H(88) | 120 | 2700 | 2700 |
| I(89) | 120 | 2700 | 2700 |

FIG.8

| ELEMENT LOCATION | Ic(A) | LIFE IN PRESENT ARRANGEMENT | LIFE AS SOLE ELEMENT |
|---|---|---|---|
| A(89) | 120 | 3100 | 2700 |
| B(88) | 120 | 3100 | 2700 |
| C(87) | 115 | 2700 | 2400 |
| D(86) | 115 | 2700 | 2400 |
| E(85) | 110 | 2300 | 2000 |
| F(84) | 105 | 2000 | 1700 |
| G(83) | 100 | 1400 | 1400 |
| H(82) | 95 | 1000 | 1000 |
| I(81) | 90 | 700 | 700 |

FIG.23
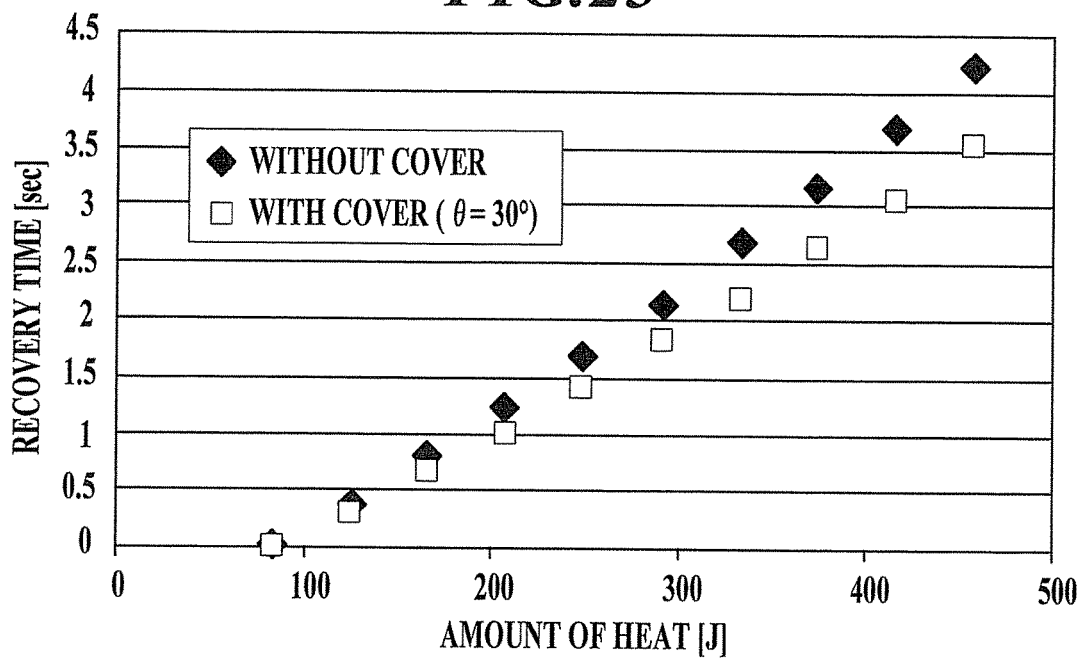
FIG.24
| | NO COVER | 20° | 25° | 30° | 45° | 60° | 70° | 75° | 80° |
|---|---|---|---|---|---|---|---|---|---|
| RECOVERY TIME [sec] | 2.76 | 2.61 | 2.51 | 2.48 | 2.42 | 2.57 | 2.59 | 2.74 | 2.78 |
FIG.25
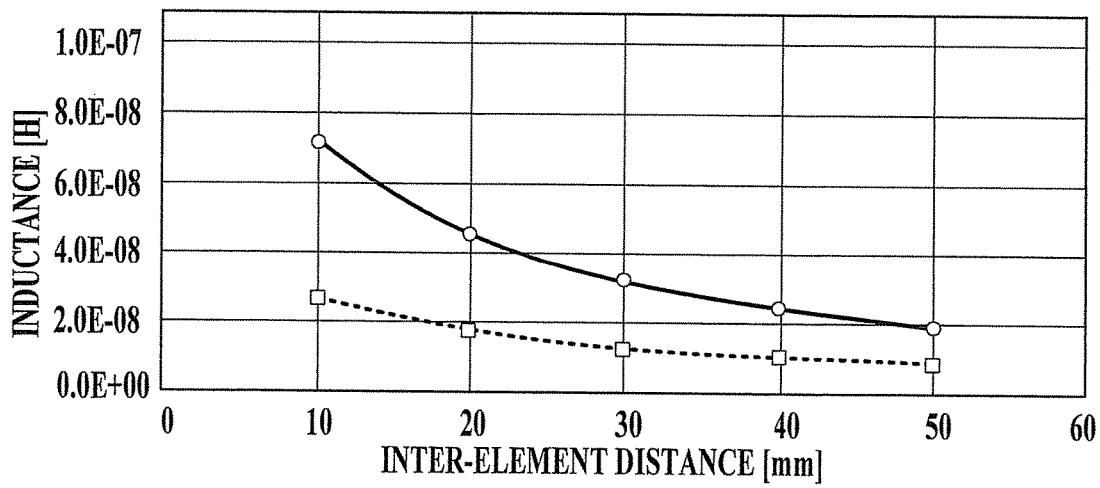

SUPERCONDUCTING FAULT CURRENT LIMITER AND COOLING METHOD FOR SUPERCONDUCTING ELEMENT WITHIN SUPERCONDUCTING FAULT CURRENT LIMITER

CROSS-REFERENCE TO RELATED APPLICATIONS

This application is a U.S. National Stage patent application filing under 35 USC § 371 of international Patent Cooperative Treaty (PCT) Application No. PCT/JP2014/052855, filed on Feb. 7, 2014, and entitled "SUPERCONDUCTING FAULT CURRENT LIMITER AND COOLING METHOD FOR SUPERCONDUCTING ELEMENT WITHIN SUPERCONDUCTING FAULT CURRENT LIMITER," which claims priority to Japanese Patent Application No. 2013-025068, filed on Feb. 13, 2013 and also claims priority to Japanese Patent Application No. 2013-025069, filed on Feb. 13, 2013, all of which applications are incorporated by reference herein in their entireties.

TECHNICAL FIELD

The present invention relates to a superconducting fault current limiter and a cooling method for a superconducting element within superconducting fault current limiter.

BACKGROUND ART

A fault current limiter is a device that is installed in an electric power system or the like. An installed fault current limiter can reduce a fault current caused by a short circuit or the like so as to reduce damage on a device connected thereto.

While typical conventional fault current limiters are of the reactor type, superconducting fault current limiters have been proposed in recent years. Such superconducting fault current limiters have a superconducting element inserted in a current pathway, which remains in a superconducting state while a current flows within a defined current range but changes to a normal conducting state in the event of a fault current that exceeds the critical current of the superconducting element so as to reduce the fault current by virtue of its resistance.

The superconducting element used in such fault current limiters is cooled by being immersed in a liquid coolant such as liquid helium and liquid nitrogen in order to maintain an ultralow temperature condition. In the event of a fault current, the superconducting element changes to a normal conducting state, and the element temperature is drastically increased.

A fault current limiter is used generally along with a fault current breaker. In the event of a fault current, it is required to reduce the fault current until the breaker works (approximately 0.1 [s]). Unless the superconducting element is cooled immediately once the breaker cuts off the fault current, the element life is largely decreased, which eventually decrease the life of the fault current limiter.

In particular, when a plurality of superconducting elements are used, a superconducting element with the lowest critical current tends to generate a heat for the longest time and to have a shorter life than the other superconducting elements. Eventually the life of the overall device is decreased to a great extent.

To cope with the problem, superconducting fault current limiters require rapid cooling of the superconducting element when it generates a heat.

For example, Patent Document 1 discloses a cooling structure that includes a coolant vessel that accommodates a semiconductor element as a heat source and a liquid coolant, a partition wall that divides the inner space of the coolant vessel into a coolant supplying area and an element disposed area, a coolant jetting port that is a nozzle extending from the partition wall toward the semiconductor element, and a disturbance forming member that disturbs the flow of the coolant near the outlet of the coolant jetting port.

In this cooling structure, the liquid coolant is jetted from the coolant jetting port toward the semiconductor element by using supplying pressure of the coolant, and the disturbance forming member disturbs the flow of the coolant so that nucleate boiling occurs on the overall flat surface of the semiconductor element as uniformly as possible. With this configuration, high cooling efficiency is achieved.

Patent Document 2 discloses a cooling structure that includes a coolant vessel that accommodates a semiconductor element as a heat source and a liquid coolant, a cooling pipe disposed between the inner and outer walls of the coolant vessel, and a plurality of protrusions that extend from the inner wall of the coolant vessel toward the semiconductor element so as to trap bubbles.

In this cooling structure, the protrusions capture bubbles of the coolant that are produced due to the increased temperature of the semiconductor element, so as to proactively cool down the bubbles. With this, high cooling efficiency is achieved.

Patent Document 3 discloses a cooling device that includes a coolant vessel that houses a semiconductor element and liquid coolant, and a cooling fin disposed on the outer wall of the coolant vessel.

In this cooling structure, the semiconductor element is disposed on the inner bottom of the coolant vessel, and a flow path heading right above from the semiconductor element and a flow path that returns the coolant to the bottom around the semiconductor element are formed. The liquid coolant heated by the semiconductor element rises along the center flow path and is then cooled by the cooling fin when it flows down along the outer flow path. With this circulation, improved cooling efficiency is achieved.

Patent Document 4 discloses providing a coolant vessel that accommodates a liquid coolant and a superconducting device as a component to be cooled, a partition plate that surrounds the superconducting device in the coolant vessel, a heat exchanger that independently cools the inner area and the outer area of the partition plate. The coolant is cooled such that the inner area of the partition plate is cooler than the outer area, so that the coolant flows down in the inner side of the partition plate and flows up in the outer side of the partition plate. With this configuration, improved cooling efficiency is achieved.

PRIOR ART DOCUMENT

Patent Document

Patent Document 1: JP H06-104358A
Patent Document 2: JP S62-085449A
Patent Document 3: JP H04-023457A
Patent Document 4: JP S63-299181A

SUMMARY OF INVENTION

Problem to be Solved by the Invention

However, the cooling structure of Patent Document 1 is intended to cool the semiconductor element that undergoes a rather moderate temperature rise. Accordingly, it is envisioned that only nucleate boiling occurs on the surface of the element.

However, in the event of a fault current, a superconducting element is heated from the temperature of liquid nitrogen (77 K) to room temperature (300 K). Accordingly, film boiling occurs at the surface of the superconducting element. Even if the cooling structure of Patent Document 1 is applied to such a superconducting fault current limiter, the liquid coolant from the coolant jetting port does not reach the surface of the superconducting element because the surface of the superconducting element is covered with gas of the vaporized liquid coolant. Therefore, it is difficult to achieve sufficient cooling.

Further, the cooling structure described in Patent Document 1 requires the specially structured cooling vessel provided with the partition wall disposed therein, the coolant jetting port formed in the partition wall and the like. This causes problems such as the complicated overall structure and an increased cost for the device.

In the cooling structure of Patent Document 2, capturing bubbles is a cooling method for nucleate boiling. Therefore, when film boiling occurs, in which the coolant is vaporized as if the vapor is stuck on the overall surface of the element, it is impossible to achieve efficient cooling.

Also, the cooling structure of Patent Document 2 requires a specially structured cooling vessel provided with the cooling pipe disposed between the inner and outer walls, the protrusions on the inner wall and the like. This causes problems such as the complicated overall structure and an increased cost for the device.

In the cooling device of Patent Document 3, since the component to be cooled is a semiconductor element, it is intended to cool it only to ambient temperature, and the cooling fin disposed on the outer side of the coolant vessel bears the cooling of the liquid coolant.

However, a superconducting fault current limiter requires to cool its superconducting element to an ultralow temperature. Further, in the event of a fault current, the superconducting element causes severe film boiling in the liquid coolant. Therefore, it is difficult for the cooling device with such cooling efficiency to cool a superconducting element.

The cooling device of Patent Document 4 is intended to cool a superconducting device but is not capable of coping with severe film boiling on a superconducting element. That is, this conventional cooling device creates the circulation that flows down in the inner area of the partition plate where the superconducting device is disposed and flows up in the outer area. Therefore, when the superconducting element causes boiling, rising bubbles creates a reverse flow. Therefore, it is difficult to achieve efficient cooling.

It is an object of the present invention to provide a superconducting fault current limiter that performs efficient cooling when film boiling occurs on the surface of a superconducting element, and a cooling method for a superconducting element within a superconducting fault current limiter.

Means for Solving the Problem

The present invention is a superconducting fault current limiter comprising superconducting elements which are in a superconducting state when an electric current flows within a certain range of electric current values and which change to a normal conducting state when a fault current flows exceeding the range, including: a coolant vessel which accommodates a liquid coolant and the plurality of superconducting elements; and a cooling means which cools the liquid coolant in the coolant vessel, wherein among the plurality of superconducting elements, a superconducting element with a lowest critical current is disposed over another superconducting element in the liquid coolant.

Also, the present invention is a cooling method for superconducting elements in a superconducting fault current limiter which comprises the superconducting elements which are in a superconducting state when an electric current flows within a certain range of electric current values and which change to a normal conducting state when a fault current flows exceeding the range, including: disposing the plurality of superconducting elements such that a superconducting element with a lowest critical current is located over another superconducting element in a liquid coolant in a coolant vessel; and cooling the superconducting element with the lowest critical current by using bubbles which are produced on the another superconducting element disposed below the superconducting element with the lowest critical current.

In the cooling method for the superconducting elements in the superconducting fault current limiter, the superconducting element with the lowest critical current may be cooled when the liquid coolant is in a film boiling state on a surface of the superconducting element with the lowest critical current.

In the cooling method for the superconducting elements in the superconducting fault current limiter, the plurality of superconducting elements may be disposed in the liquid coolant such that a superconducting element with a lower critical current is at a higher location.

In the cooling method for the superconducting elements in the superconducting fault current limiter, the plurality of superconducting elements may be arranged in a plane parallel to a vertical direction and be disposed such that an upper superconducting element of each pair of vertically adjacent two superconducting elements has a lower critical current than a lower superconducting element.

In the cooling method for the superconducting elements in the superconducting fault current limiter, a plurality of sets, each composed of the plurality of superconducting elements arranged in the plane parallel to the vertical direction, may be disposed so that the plurality of superconducting elements are disposed three-dimensionally as a whole.

In the cooling method for the superconducting elements in the superconducting fault current limiter, an element cover which has open upper and lower ends and which surrounds the plurality of superconducting elements may be disposed in the coolant vessel.

Also, the present invention is a superconducting fault current limiter comprising superconducting elements which are in a superconducting state when an electric current flows within a certain range of electric current values and which change to a normal conducting state when a fault current flows exceeding the range, including: a coolant vessel which accommodates a liquid coolant and the plurality of superconducting elements; and a cooling means which cools the liquid coolant in the coolant vessel, wherein at least two of the plurality of superconducting elements are vertically arranged in the liquid coolant, and wherein the superconducting fault current limiter further comprises an element cover which has open upper and lower ends and which surrounds the at least two superconducting elements vertically arranged in the coolant vessel.

Also, the present invention is a cooling method for superconducting elements in a superconducting fault current limiter which comprises the superconducting elements which are in a superconducting state when an electric current flows within a certain range of electric current values and which change to a normal conducting state when a fault current flows exceeding the range, including: disposing vertically at least two of the plurality of superconducting elements in an element cover which has open upper and lower ends and which is disposed in a liquid coolant in a coolant vessel; and leading bubbles produced on a lower superconducting element of the plurality of superconducting elements toward an upper superconducting element of the plurality of superconducting elements.

In the cooling method for the superconducting elements in the superconducting fault current limiter, the liquid coolant on a surface of the upper superconducting element of the plurality of superconducting elements may be in a film boiling state.

In the cooling method for the superconducting elements in the superconducting fault current limiter, a lower superconducting element of the vertically arranged at least two superconducting elements surrounded by the element cover may be disposed such that a lower end of the lower superconducting element is located higher than a lower end of the element cover.

In the cooling method for the superconducting elements in the superconducting fault current limiter, the vertically arranged two superconducting elements may be disposed such that the following expression (I) is satisfied, $$\tan^{-1}(L/R) \leq 70° \quad (I)$$

where R is a distance from centers of the vertically arranged two superconducting elements to an inner surface of the element cover in a longitudinal direction in a plan view of the two superconducting elements, and L is an inter-center distance between the vertically arranged two superconducting elements in the vertical direction of the two superconducting elements.

The element cover may also surround a different superconducting element other then the vertically arranged two superconducting elements. When there are a plural sets of vertically arranged two superconducting elements, the element covers may be provided individually for the respective sets.

Effects of Invention

According to the present invention, a superconducting element with the lowest critical current among the plurality of superconducting elements is disposed over another superconducting element in the liquid coolant in the coolant vessel. In the event of a fault current, the superconducting elements undergo a drastic temperature rise and cause film boiling. Then, the liquid coolant is vaporized on the surface of the superconducting elements, and the vaporized gas is released upward. The superconducting element with the lowest critical current, which is disposed over another superconducting element, is exposed to the rising gas.

In the film boiling state, the cooling efficiency is decreased because the vaporized gas is produced in the form of a film stuck on the surface the superconducting elements. When the superconducting element in this condition is exposed to the rising vaporized gas bubbles and a liquid flow created by the bubbles, they assist the vaporized gas on the surface of the element to be released so as to bring the surface in contact with the liquid coolant. Therefore, the cooling efficiency of the superconducting element with the lowest critical current is improved.

As a result, it becomes possible to extend the life of the superconducting element with the lowest critical current, which has the shortest life, and thus to achieve the extended life of the overall superconducting fault current limiter.

Since the improvement of the cooling efficiency is achieved by the arrangement of the superconducting elements, a special structure or a specific configuration is not required for cooling. This allows simplification of the overall superconducting fault current limiter and a cost reduction.

The plurality of superconducting elements may be disposed in the liquid coolant such that a superconducting element with a lower critical current is at a higher location. In this case, even when some of the plurality of superconducting elements has a low critical current, all of them can be cooled by vaporized gas from the other superconducting elements so that their life is extended. Therefore, it becomes possible to achieve the further extended life of the superconducting fault current limiter.

When each pair of the vertically adjacent superconducting elements among the plurality of superconducting elements arranged in a plane is disposed such that the upper superconducting element has a lower critical current than the lower superconducting element, the plurality of superconducting elements arranged in a plane are eventually disposed such that an superconducting element at a higher location has a lower critical current. Therefore, effective life extension of the superconducting fault current limiter can be achieved.

When a plurality of sets, each composed of the plurality of superconducting elements arranged in a plane, are disposed so that the superconducting elements are arranged three-dimensionally as a whole, vaporized gas flow that are produced on a plurality of lower superconducting elements can be led together to upper superconducting elements. Therefore, the life of the superconducting element with a low critical current is extended, and it becomes thus possible to achieve life extension of the superconducting fault current limiter.

When the plurality of superconducting element is surrounded by the element cover, the flow of the vaporized gas produced on the lower superconducting element can be led to the upper superconducting element without diffusion of the gas. Therefore, the life of the superconducting element with a low critical current can be extended, and it becomes thus possible to achieve further life extension of the superconducting fault current limiter.

In the present invention, two superconducting elements are disposed in the liquid coolant in the coolant vessel such that one superconducting element is disposed over the other superconducting element in the element cover. When the superconducting elements undergo a drastic temperature rise due to a fault current, film boiling occurs on each of the superconducting elements. Then, vaporized gas of the liquid coolant that is produced on the surface of the lower superconducting element is released upward, and the upper superconducting element is exposed to this vaporized gas that is rising along the element cover.

When film boiling occurs on the superconducting elements, the vaporized gas is produced in the form of a film stuck on the surface thereof. Therefore, the cooling efficiency is reduced. When the superconducting element in this condition is exposed to rising vaporized gas bubbles and a resultant liquid flow from below, they assist the vaporized gas produced on the element surface to be released so as to bring the surface in contact with the liquid coolant. Therefore, the cooling efficiency of the upper superconducting element is improved.

As described above, the superconducting element located over another superconducting element can be efficiently cooled by using the element cover, and the life of the superconducting element can be extended. Therefore, it becomes possible to achieve life extension of the superconducting fault current limiter.

Since the improvement of the cooling efficiency is achieved by the element cover and the arrangement of the superconducting elements, a special structure or a specific configuration for cooling is not required. This allows simplification of the overall superconducting fault current limiter and a cost reduction.

When the lower superconducting element is disposed in the element cover such that the lower end thereof is located higher than the lower end of the element cover, vaporized gas bubbles from the lower superconducting element can be led toward the upper superconducting element without a leak of the bubbles out of the element cover. Therefore, it becomes possible to cool the upper superconducting element more efficiently and thus to achieve life extension.

Regarding the superconducting elements in the element cover, when the relative relationship between the distance R from the centers of the two superconducting elements in the longitudinal direction to the inner surface of the element cover and the distance L between the centers of the two superconducting elements in the vertical direction is defined by the numerical range of the expression (I), the element cover can reduce diffusion of the coolant gas. Therefore, it becomes possible to cool the upper superconducting element effectively.

BRIEF DESCRIPTION OF DRAWINGS

FIG. 2 This is a graph illustrating the relationship between heating time and electrode contact resistance when a typical superconducting element is continuously heated at 100° C.

FIG. 3 This is a table illustrating the properties of a superconducting element with a high critical current and a superconducting element with a low critical current that are solely disposed to perform current limiting operations.

FIG. 4 This is a table illustrating the result of comparison of life in the number of fault current limiting operations between Example 1 and Comparison 1.

FIG. 7 This is a table illustrating a change of the life of each superconducting element of Example 2.

FIG. 8 This is a table illustrating a change of the life of each superconducting element of Comparison 2.

FIG. 23 This illustrates the result of comparison in recovery time of superconducting elements from a heated condition to a coolant temperature between presence and absence of an element cover.

FIG. 24 This is a table of recovery times of superconducting elements from a heated state when the angle of the vertical arrangement of the superconducting elements with respect to an element cover is changed to different values.

FIG. 25 This is a graph illustrating the relationship between inter-element distance and mutual inductance, which is calculated based on a simulation.

DESCRIPTION OF EMBODIMENTS

First Embodiment

Hereinafter, a first embodiment of the present invention will be described in detail based on the drawings.

Figure 1:
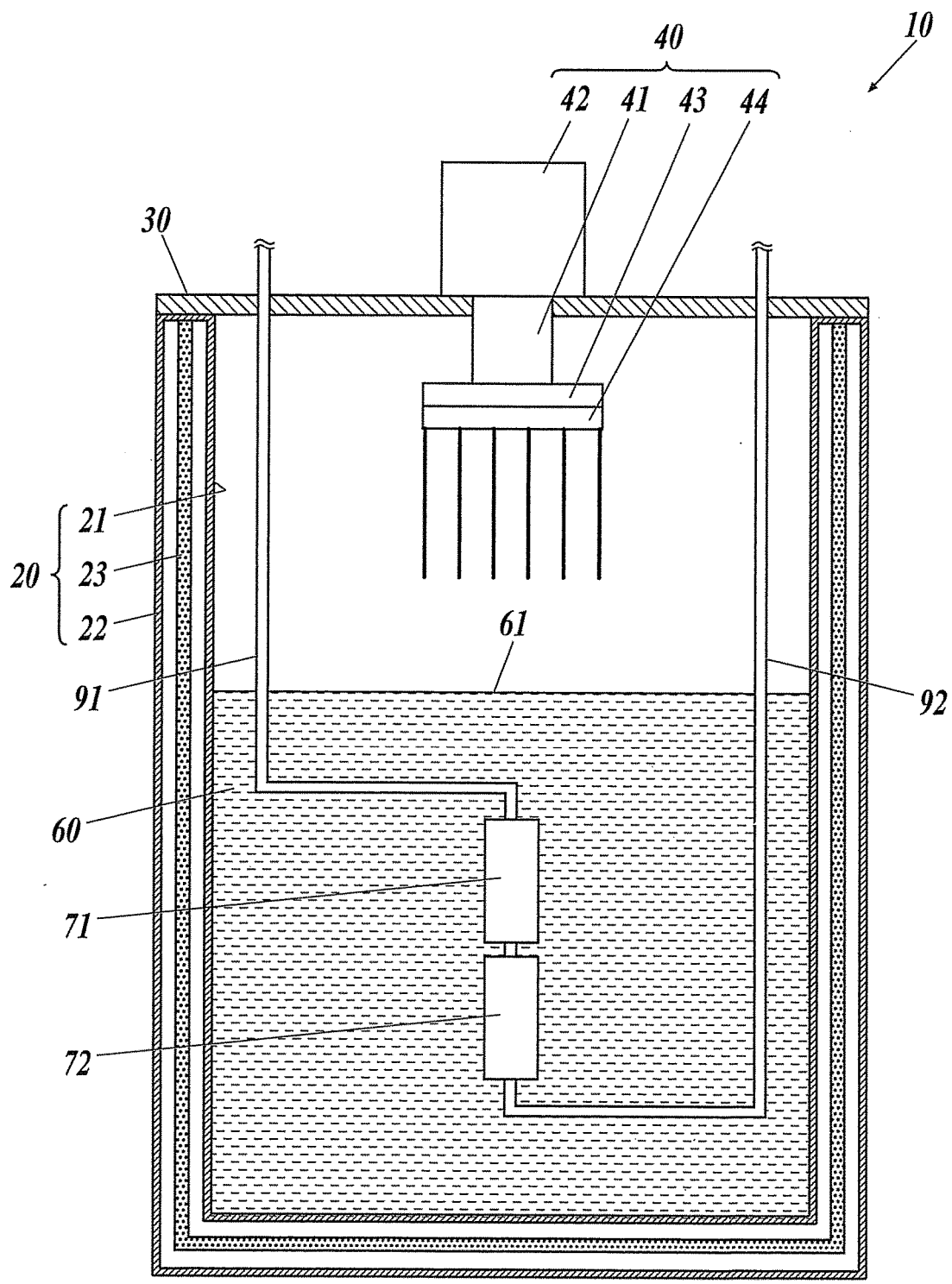
FIG. 1 This is a cross sectional view of a superconducting fault current limiter according to a first embodiment, taken along a vertical plane.

In the first embodiment, a superconducting fault current limiter 10, which is installed in the middle of a power supply path of an externally-powered device to be protected in order to reduce a fault current occurred in a power source, and a cooling method for superconducting elements 71, 72 in the superconducting fault current limiter 10 are described. FIG. 1 is a cross sectional view of the superconducting fault current limiter 10 taken along a vertical plane.

The superconducting fault current limiter 10 includes an inner vessel 21 and an outer vessel 22 that are vacuum-insulated, a coolant vessel 20 that accommodates liquid nitrogen 60 as liquid coolant and the two superconducting elements 71, 72 described below, a lid member 30 capable of closing the upper opening of the coolant vessel 20, and a freezer 40 as a cooling means to cool the liquid nitrogen 60 in the inner vessel 21.

When the current flowing though the superconducting fault current limiter 10 is within the range not exceeding the critical current of both of the superconductive elements 71, 72, it remains in a super conductive state. In the event of a fault current that exceeds the critical current of at least either one of the superconductive elements 71, 72, the superconducting fault current limiter changes to a normal conducting state to have an electric resistance so as to prevent the excessive current from flowing to a device under protection.

Hereinafter, the components of the superconducting fault current limiter 10 will be described.

Coolant Vessel

The coolant vessel 20 is a double-walled bottomed vessel including the inner vessel 21 and the outer vessel 22 that are vacuum-insulated from each other.

The inner vessel 21 has a vertical cylindrical shape with a closed lower end as the bottom and an open upper end.

As with the inner vessel 21, the outer vessel 22 has a vertically cylindrical shape with a closed lower end as the bottom and an open upper end. The outer vessel 22 is slightly larger than the inner vessel 21 and houses the inner case 21 therein. Further, the inner vessel 21 and the outer vessel 22 are integrally joined to each other at the respective upper ends so that an interspace is formed between the outer circumferential side and outer bottom of the inner vessel 21 and the inner circumferential side and inner bottom of the outer vessel 22. The interspace between the inner vessel 21 and the outer vessel 22 is vacuumed to provide vacuum insulation.

Further, a super insulation material 23, which is constituted by a laminate of aluminum-deposited polyester films, is provided over the whole cylindrical part and the bottom part of the interspace between the inner vessel 21 and the outer vessel 22 in order to shield the inside from external radiation heat.

Lid Member

The joining part between the inner vessel 21 and the outer vessel 22 (the upper end face of the coolant vessel 20) is formed in a flat shape, and a disk lid member 30 is mounted on this ring flat face (upper end face).

The lid member 30 is mounted detachably from the coolant vessel 20 so that the inner space of the coolant vessel 20 is accessible for maintenance. The lid member is fixed on the coolant vessel 20 in a well-known manner in the art, for example, by means of a fitting structure between a concave and a convex of the lid member 30 and the coolant vessel 20 or by means of bolts.

Since the lid member 30 supports the refrigerator 40 that hangs down from the lid member 30, it is preferably made of a material that can impart sufficient strength. Specifically, the lid member 30 may be made of FRP (fiber reinforced plastic), stainless steel, etc.

As with the coolant vessel 20, the lid member 30 may also have a vacuum-insulated double-walled hollow structure in order to improve the heat insulation.

Refrigerator

The refrigerator 40 is a so-called GM refrigerator using a regenerating material. The refrigerator 40 includes a cylinder section 41 that allows vertical reciprocation of a displacer vessel containing the regenerating material, a drive section 42 that houses a crank mechanism driven by a motor to vertically reciprocate the displacer vessel, and a heat exchanger 44 that serves as a heat exchanging member and is provided in a cryo-transfer section 43 where the temperature is the lowest in the cylinder section 41.

The refrigerator 40 is connected to a compressor and the like (not shown) so that coolant gas is pumped to and from the inner space of the refrigerator 40.

Superconducting Element

The two superconducting elements 71, 72, which have the same dimension and the same structure, are a strip-shaped flat plate. The two superconducting elements 71, are connected in series in the current flowing direction. The two ends of the serially-connected two superconducting elements 71, 72 are respectively connected to electric current leads 91, 92 that vertically penetrate the lid member 30 to be supported by the lid member 30. That is, a fault current flows from one of the electric current leads 91, 92 to the other of the electric current leas 92, 91 via the two superconducting elements 71, 72.

The superconductor of the superconducting elements 71, 72 may be a RE-based superconductor (RE: rare earth element) that turns into a superconducting state at a temperature equal to or higher than the temperature of liquid nitrogen. Typical RE-based superconductors include, for example, yttrium-based superconductors represented by the chemical formula: $YBa_2Cu_3O_{7-y}$ (hereinafter referred to as Y-based superconductors). When an RE-based superconductor is used, a superconducting tape in which the RE-based superconductor is formed on a metal tape substrate via an intermediate layer may also be used instead of a strip-shaped flat plate. Further, a superconducting tape in which the superconductor is formed in a metal matrix may also be used. The superconductor may be a bismuth-based superconductor, for example, superconductors represented by the chemical formula $Bi_2Sr_2CaCu_2O_{8+}\delta$ (Bi2212) or $Bi_2Sr_2Ca_2Cu_3O_{10+}\delta$ (Bi2223). In the chemical formulae, $\delta$ is the non-stoichiometric compositional ratio of oxygen.

The two superconducting elements 71, 72 are supported by a frame (not shown) such that they are located below a predetermined liquid level 61 of the liquid nitrogen 60 in the coolant vessel 20, their longitudinal direction is in the vertical direction, and their flat plate surfaces are parallel to the vertical direction.

The two superconducting elements 71, 72 used have a different critical current from each other, under which they can maintain the superconducting state. The superconducting element 71 having a lower critical current is disposed over the superconducting element 72 having a higher critical current.

Specifically, one superconducting element 71 has a critical current of 100 [A], while the other superconducting element 72 has a critical current of 120 [A]. These values of the critical current are merely an example, and the superconducting elements may have any critical current as long as they meet the condition that the upper superconducting element 71 has a lower critical current than the lower superconducting element 72.

The life of a superconducting element will be described. FIG. 2 illustrates the relationship between heating time and contact resistance with an electrode when a typical superconducting element is continuously heated at 100° C. (100 degrees Celsius). The contact resistance with an electrode of a superconducting element is a characteristic value that indicates deterioration of the superconducting element. In FIG. 2, the increase ratio of the resistance of the superconducting element with respect to the original value is shown in percent. When the contact resistance reaches 100%, the superconducting element is determined to reach its end of life.

As illustrated in the figure, the contact resistance of superconducting elements tends to increase with an increase of the heating time.

FIG. 3 illustrates the properties of a superconducting element with a higher critical current and a superconducting element with a lower critical current when they are disposed solely and an electric current of 200 [A] is applied for 0.1 [s] (hereinafter, this passage of the electric current is referred to as a "current limiting operation"). In the superconducting element with a higher critical current Ic (Ic=120 [A]), which is shown in the upper line of FIG. 3, the passage of the electric current increased the element temperature to 60° C. (60 degrees Celsius), and the recovery time to the normal temperature was 12 [s]. The number of current limiting operations before the end of life was approximately 2700 times.

In contrast, in the superconducting element with a lower critical current Ic (Ic=100 [A]), which is shown in the lower line of FIG. 3, the passage of the electric current increased the element temperature to 100° C. (100 degrees Celsius), and the recovery time to the predetermined temperature was 15 [s]. The number of current limiting operations before the end of life was approximately 700 times.

A superconducting fault current limiter reaches the end of its life when at least one of its plurality of superconducting elements reaches the end of its life. Accordingly, when a superconducting element with a higher critical current and a superconducting element with a lower critical current are arranged horizontally at the same vertical location, the life of the superconducting fault current limiter becomes 700 times in the number of current limiting operations.

In contrast, the superconducting fault current limiter 10 according to the embodiment of the present invention is characterized by the arrangement of the superconducting element 71 with a lower critical current (Ic=100 [A]) and the superconducting element 72 with a higher critical current (Ic=120 [A]) in the liquid nitrogen in the coolant vessel 20.

That is, in the superconducting fault current limiter 10 (Example 1) according to the embodiment, the superconducting element 71 with a lower critical current (Ic=100 [A]) is disposed over the superconducting element 72 with a higher critical current (Ic=120 [A]).

Hereinafter, with reference to FIG. 4, the properties of the above-described Example 1 are compared to those of Comparison 1 in which a superconducting element with a higher critical current (Ic=120 [A]) is disposed over a superconducting element with a lower critical current (Ic=100 [A]) in a liquid nitrogen in a coolant vessel.

In Comparison 1, the life of the upper superconducting element with a higher critical current is 3100 times in the number of current limiting operations, which is extended by approximately 400 times compared to a solely disposed element. However, the life of the lower superconducting element with a lower critical current remains 700 times in the number of current limiting operations. Therefore, the life of the superconducting fault current limiter is the same as conventional ones, i.e. 700 times.

In contrast, in Example 1, the life of the lower superconducting element 72 with a higher critical current is 2700 times in the number of current limiting operations, which is the same as that of a solely disposed element. However, the life of the upper superconducting element 71 with a lower critical current is 800 times in the number of current limiting operations, which is extended by approximately 100 times compared to a solely disposed element. Therefore, the life of the superconducting fault current limiter 10 is also extended to 800 times in the number of current limiting operations, and the extended life cycle is achieved.

Superconducting elements are cooled by surrounding ultralow-temperature liquid nitrogen. However, when a current by far exceeding their critical current, such as a fault current, flows, the superconducting elements are transited from a superconducting state to a normal conducting state and drastically generate a heat, due to the increased electric resistance. As a result, the temperature of the superconducting elements becomes very high relative to the liquid nitrogen, and the liquid nitrogen thereby turns into the film boiling state beyond the nucleate boiling state.

Once film boiling occurs, the surfaces of the superconducting elements are covered with nitrogen gas that has a lower cooling efficiency than liquid nitrogen. Accordingly, it requires a longer time td cool the superconducting elements.

Figure 5:
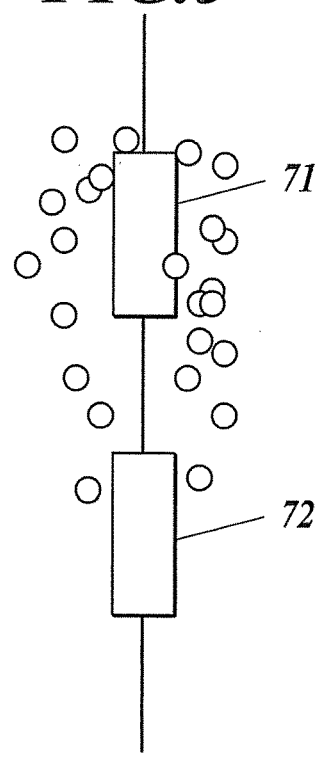
FIG. 5 This is an explanatory view illustrating the principle of cooling by the arrangement of superconducting elements of Example 1.

However, when the superconducting elements 71, 72 are vertically arranged, film boiling occurs on both of the superconducting elements 71, 72 in the event of a fault current, and the nitrogen gas from the lower superconducting element 72 becomes bubbles and passes through around the upper superconducting element 71 as illustrated in FIG. 5. At this moment, the bubbles and a liquid flow created by the rising bubbles assist the nitrogen gas in the film boiling state generated on the surface of the upper superconducting element 71 to be released so as to bring back the surface of the upper superconducting element 71 in contact with the liquid nitrogen. Accordingly, the deterioration of the cooling efficiency is reduced. As a result, the upper superconducting element 71 is cooled more rapidly than when it is solely disposed or is horizontally arranged with other superconducting elements, and the extended life cycle is thus achieved.

In the superconducting fault current limiter 10, in accordance with the extension of the life of the superconducting element 71 with a lower critical current that determines the life of the overall device, the extension of the life of the superconducting fault current limiter 10 itself is also achieved.

Second Embodiment

The second embodiment of the present invention will be described in detail based on the drawings. A superconducting fault current limiter according to the second embodiment is different from the previously-described superconducting fault current limiter 10 according to the first embodiment in the number and the arrangement of superconducting elements, but is the same in the other components (coolant vessel 20, lid member 30, liquid nitrogen 60, refrigerator 40, electric current leads 91, 92, and the like). Accordingly, the superconducting elements will be mainly described here.

Figure 6:
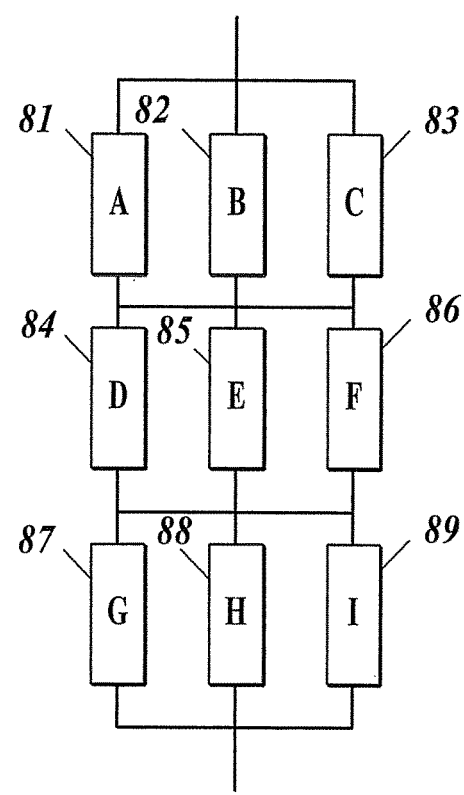
FIG. 6 This is an explanatory view illustrating the arrangement of superconducting elements in a superconducting fault current limiter according to a second embodiment.

As illustrated in FIG. 6, nine superconducting elements 81 to 89 are used in the superconducting fault current limiter according to the second embodiment.

Each of the superconducting elements 81 to 89 is a strip-shaped flat plate made of a superconducting material. The superconducting elements 81 to 89 are supported such that their longitudinal directions are in the vertical direction, and their flat plate surfaces are arranged in the same vertical plane.

Further, the superconducting elements 81 to 89 are connected by wiring so that a first element group composed of the parallely-connected three superconducting elements 81, 82, 83, a second element group composed of the parallely-connected three superconducting elements 84, 85, 86, a third element group composed of the parallely-connected three superconducting elements 87, 88, 89 are electrically connected in series in the current flowing direction. One end of the wiring is connected to the electric current lead 91, and the other end of the wiring is connected to the electric current lead 92 (the electric current leads 91, 92 are not shown in FIG. 6).

Regarding the spatial arrangement of the superconducting elements 81 to 89, the superconducting elements 81 to 89 are arranged in both line and column directions in a plane. That is, the three superconducting elements 81, 82, 83 (at the element positions A, B and C in FIG. 6) of the first element group are aligned in the horizontal direction, and the three superconducting elements 84, 85, 86 (at the element positions D, E and F in FIG. 6) of the second element group and the three superconducting elements 87, 88, 89 (at the element positions G, H and I in FIG. 6) of the third element group are aligned similarly. Further, the superconducting elements 81, 84, 87 at the left of the respective element groups are aligned in the vertical direction, and the superconducting elements 82, 85, 88 at the center of the respective element groups, and the superconducting elements 83, 86, 89 at the right of the respective element groups are aligned similarly.

As illustrated in FIG. 7, the superconducting elements 81 to 89 have a critical current of different values. The superconducting elements 81 to 89 are disposed such that the upper superconducting element of each pair of two vertically adjacent superconducting elements has a lower critical current than the lower superconducting element.

Specifically, the superconducting elements 81, 82, 83 in the upper line have critical currents of 90, 95, 100 [A] respectively, the superconducting elements 84, 85, 86 in the middle line have critical currents of 105, 110, 115 [A] respectively, and the superconducting elements 87, 88, 89 in the lower line have critical currents of 115, 120, 120 [A] respectively.

Among the superconducting elements 81 to 89, the superconducting element 81 with the lowest critical current (Ic=90 [A]) is located in the uppermost line, and the superconducting elements 88, 89 with the highest critical current (Ic=120 [A]) are located in the lowermost line.

FIG. 7 shows a change of the life of the superconducting elements 81 to 89 in the example (Example 2) of FIG. 6 in which the superconducting elements 81 to 89 are disposed sequentially at the element positions A to I in the written order. FIG. 8 shows a change of the life of the superconducting elements 89 to 81 in Comparison 2 in which the superconducting elements 89 to 81 are disposed sequentially at the element positions A to I in the written order. In Comparison 2, the superconducting elements 81 to 89 are disposed such that the upper superconducting element of each pair of two vertically adjacent superconducting elements has a higher critical current than the lower superconducting element.

In both Example 2 and Comparison 2, the superconducting elements in the lower line have the same life as when they are disposed solely since they are not exposed to nitrogen gas bubbles from other superconducting elements.

Further, in both Example 2 and Comparison 2, the superconducting elements in the middle and upper lines have an extended life than when they are disposed solely since they are exposed to nitrogen gas bubbles from other superconducting elements located below.

However, in Comparison 2, since the superconducting element 81 with the lowest critical current and the superconducting elements 82, 83 with the second and third lowest critical currents are located in the lower line, their life cannot be extended. Therefore, life extension of the superconducting fault current limiter cannot be achieved.

In contrast, in Example 2, the life can be extended in all of the superconducting elements 81 to 86 that are likely to have a short life. Therefore, it is possible to achieve effective life extension of the superconducting fault current limiter.

The superconducting fault current limiter according to the second embodiment is an example in which nine superconducting elements are arranged in a plane. However, the number of superconducting elements can be changed to any number as long as they can be disposed such that the upper superconducting element of each pair of two vertically adjacent superconducting elements has a lower critical current than the lower superconducting element.

Regarding the wiring, the superconducting fault current limiter according to the second embodiment is an example in which the element groups each composed of the parallely-connected plurality of superconducting elements are connected in series. However, the connection is not limited thereto. For example, elements groups each composed of a serially-connected plurality of superconducting elements may be gathered by parallel connection.

Figure 9:
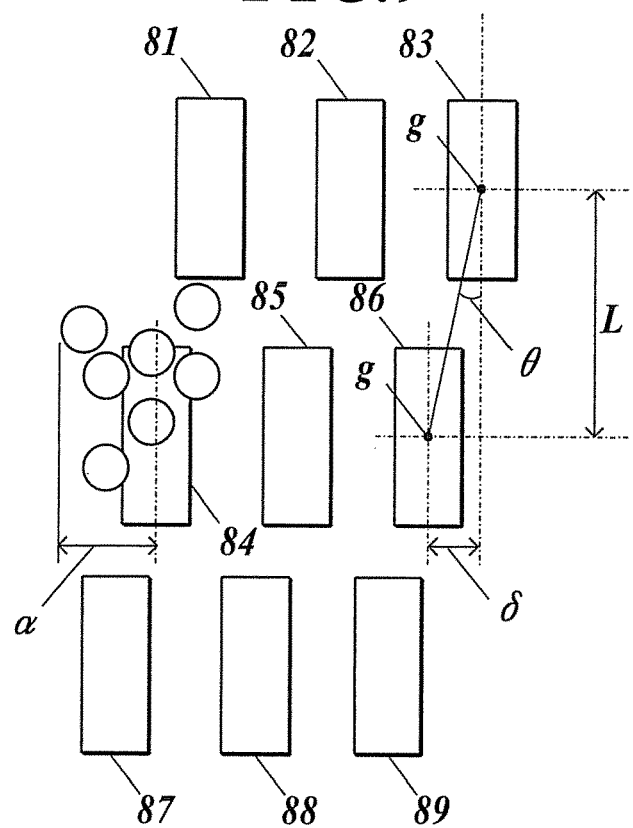
FIG. 9 This is an explanatory view illustrating a tilting limit of the superconducting element array with regard to the arrangement of superconducting elements in a superconducting fault current limiter according to a second embodiment.

The aligning direction of the vertically adjacent superconducting elements may be tilted to some extent from the vertical direction as illustrated in FIG. 9.

That is, where the intersection of the horizontal center line and the vertical center line of the flat plate of a superconducting element is defined as the center g, when the tilt angle θ of the line connecting the centers g, g of two vertically adjacent superconducting elements (e.g. the superconducting elements 83, 86) with respect to the vertical direction is equal to or less than 70° (degree) (0°≤θ≤70°), the upper superconducting element 83 can be exposed to nitrogen gas bubbles produced on the lower superconducting element 86.

By using the equation $\theta=\tan^{-1}(\delta/L)$, where L is the inter-center distance between the two superconducting elements 83, 86 in the vertical direction, and δ is the horizontal displacement of the center of an element, the superconducting elements can be disposed so that each pair of two vertically adjacent superconducting elements satisfies the following expression (1) or (2):

$$0° \leq \tan^{-1}(\delta/L) \leq 70° \quad (1)$$

$$0 \leq \delta \leq L \cdot \tan 70° \quad (2)$$

where α is the horizontal distance that bubbles from a superconducting element reach when the current exceeds the critical current, provided δ≤α.

The superconducting elements 81 to 89 can be disposed such that the arrangement is tilted in the vertical direction within the above-described range.

While FIG. 9 illustrates an arrangement that is tilted only to the right, the arrangement may also be tilted to the left within the same numerical range.

Further, a plurality of sets each composed of a plurality of superconducting elements arranged in a plane may be used, in which the plurality of sets are disposed parallel to each other so that the superconducting elements are arranged three-dimensionally as a whole. For example, such a three-dimensional arrangement can be achieved by using two or more sets each composed of the nine superconducting elements 81 to 89 of FIG. 6 and disposing the sets such that they are parallel to each other at the same height and are aligned in a direction intersecting with their planes, e.g. in the horizontal direction.

This arrangement allows bringing flows of vaporized gas from a plurality of lower superconducting elements together to the upper superconducting elements. Therefore, it is possible to achieve life extension of a superconducting element with a low critical current and thus of the superconducting fault current limiter.

Others

The position or orientation of the above-described superconducting elements 71, 72, 81 to 89 can be changed.

Figure 10:
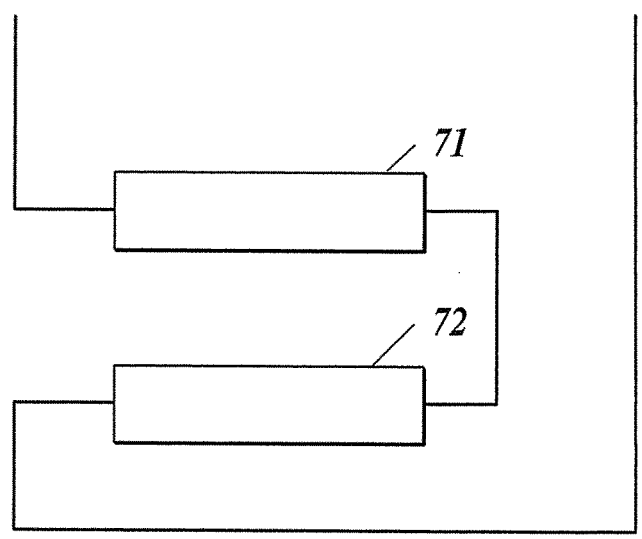
FIG. 10 This is an explanatory view illustrating another example of the orientation of disposed superconducting elements.

For example, while the superconducting elements 71, 72 are disposed such that their longitudinal direction is in the vertical direction in the above-described example, they may be disposed such that their longitudinal direction is in the horizontal direction as illustrated in FIG. 10. The same applies to the superconducting elements 81 to 89.

When the superconducting elements 71, 72 are disposed such that their longitudinal direction is in the horizontal direction, they can be disposed such that their flat plate surfaces are parallel to the horizontal plane.

Figure 11:
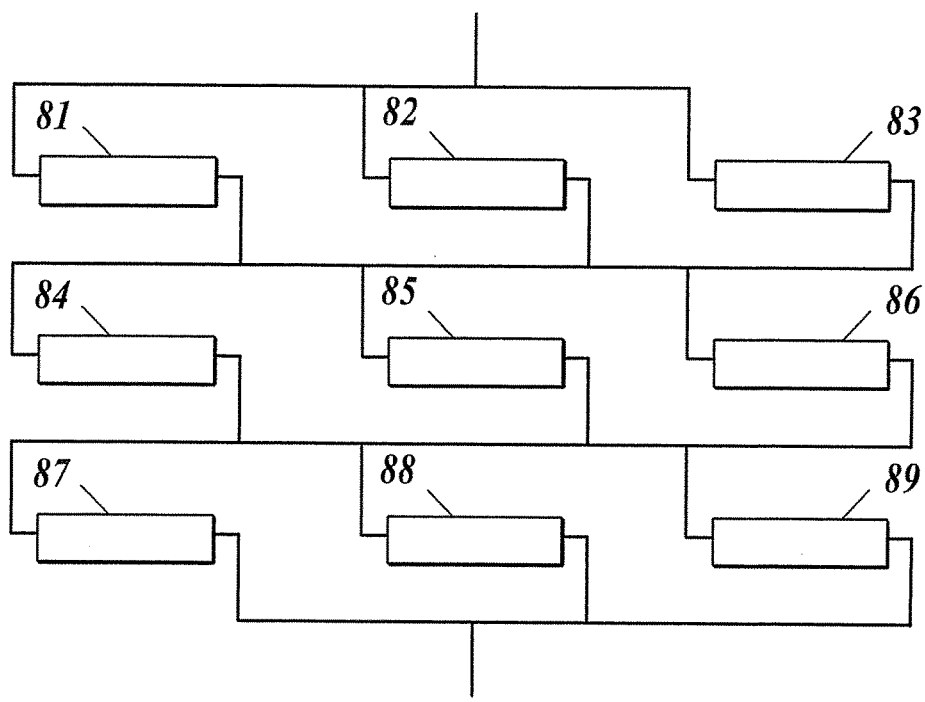
FIG. 11 This is an explanatory view illustrating another example of the arrangement of superconducting elements.

While FIG. 6 illustrates an example in which the superconducting elements 81 to 89 are disposed such that their longitudinal direction is in the vertical direction, they may be disposed such that their longitudinal direction is in the horizontal direction as illustrate in FIG. 11.

When the superconducting elements 81 to 89 are disposed such that their longitudinal direction is in the horizontal direction, they can be disposed such that their flat plate surfaces are parallel to the horizontal plane.

In FIG. 6, the superconducting elements 81, 82, are connected in parallel, and the superconducting elements 84, 85, 86 and the superconducting elements 87, 88, 89 are connected similarly, and these three groups of superconducting elements are connected in series. However, the superconducting elements 81 to 89 may be connected in any manner. For example, they may be connected in series as illustrated in FIG. 12.

Figure 12:
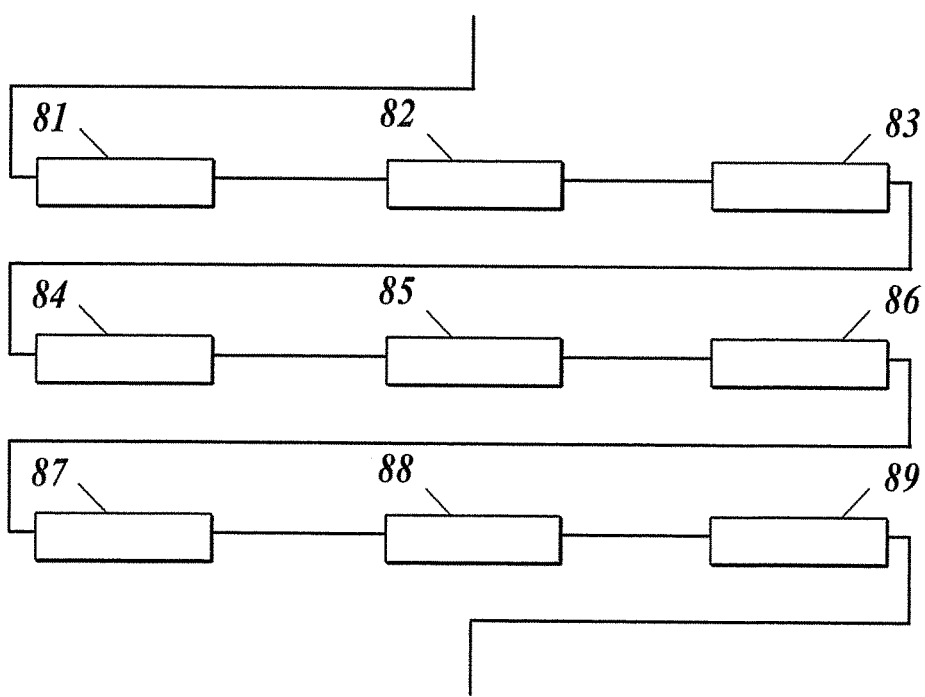
FIG. 12 This is an explanatory view illustrating yet another example of the arrangement of superconducting elements.
Figure 13:
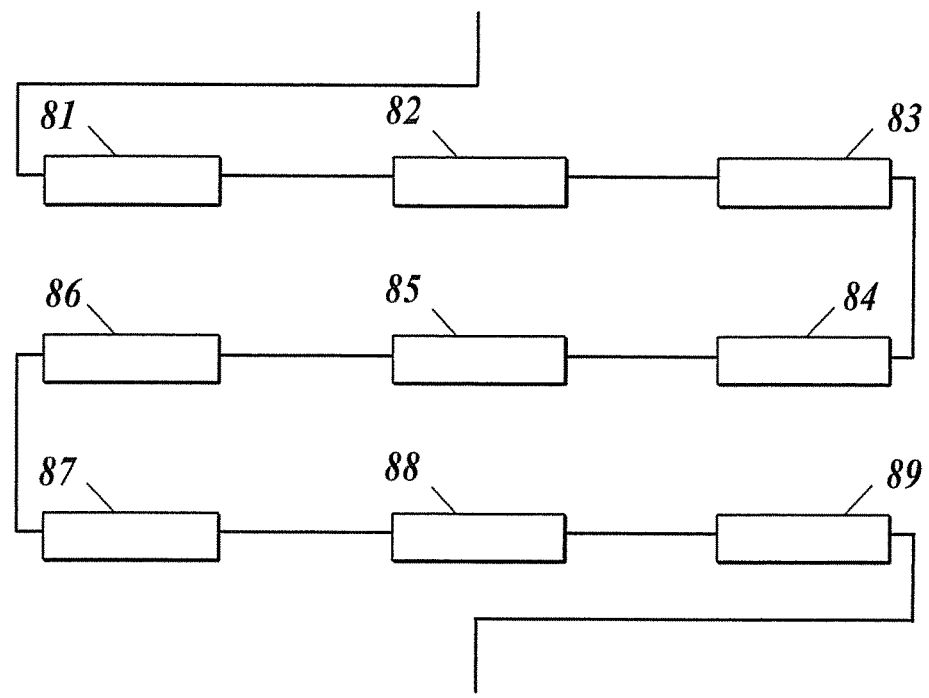
FIG. 13 This is an explanatory view illustrating yet another example of the arrangement of superconducting elements.

While FIG. 12 illustrates an example of an inductive arrangement in which the superconducting elements 81 to 89 are disposed such that an electric current flows in the same direction through them, they may be disposed in a non-inductive arrangement. For example, as illustrated in FIG. 13, the superconducting elements 81 to 89 are constituted by thin film elements using a thin film superconducting material, and the superconducting elements 81 to 89 are connected in series. The superconducting elements 81 to 89 may be disposed in an arrangement in which three superconducting elements 81, 82, 83 are aligned horizontally, it then turns back therebelow and the three superconducting elements 84, 85, 86 are aligned horizontally in the opposite direction, and it then turns back again therebelow and the three superconducting elements 87, 88, 89 are aligned horizontally in the opposite direction. In this case, the flow direction of an electric current alternates between the three groups of the superconducting elements, which provides a non-inductive arrangement.

Figure 14:
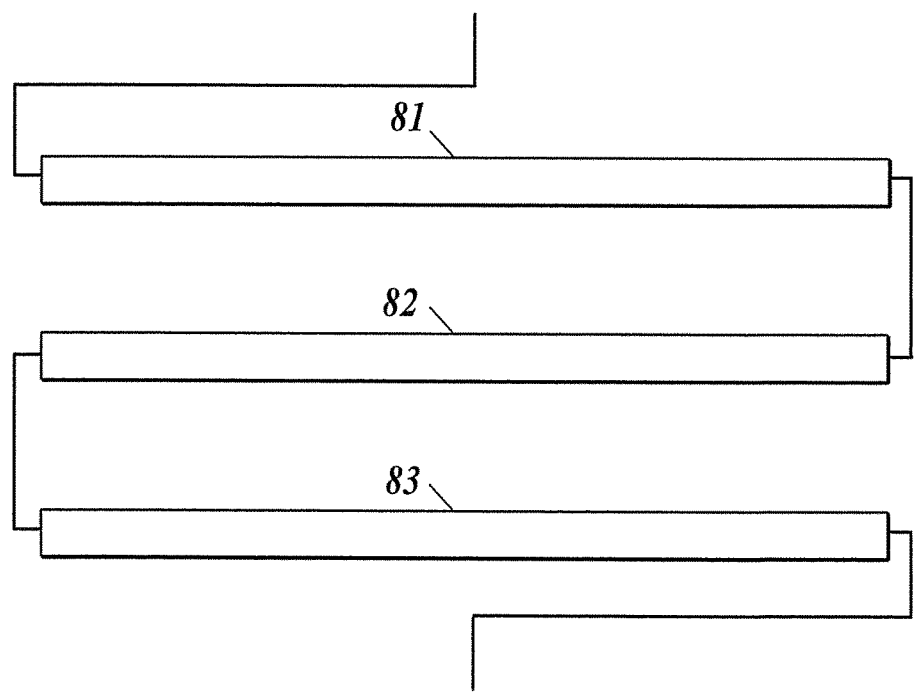
FIG. 14 This is an explanatory view illustrating yet another example of the arrangement of superconducting elements.

The non-inductive arrangement is not limited to the example of FIG. 13. For example, as illustrated in FIG. 14, the superconducting elements 81, 82, 83 are constituted by an element of a superconducting wire (an element longer than the superconducting elements of FIG. 13), and the superconducting elements 81 to 83 are connected in series. Then, the superconducting elements 81 is disposed horizontally, the arrangement then turns back therebelow and the superconducting element 82 is disposed horizontally in the opposite direction, and the arrangement then turns back again therebelow and the superconducting element 83 is disposed horizontally in the opposite direction. In this case, the flow direction of an electric current alternates between the three superconducting elements, which provides a non-inductive arrangement.

By disposing the superconducting elements or the superconducting wires in a meander non-inductive arrangement as in the examples of FIG. 13 and FIG. 14, the element group exhibits a reduced inductance compared to the configuration of FIG. 12. Therefore, a voltage at a rated current in the superconducting fault current limiter 10 can be reduced.

Figure 15:
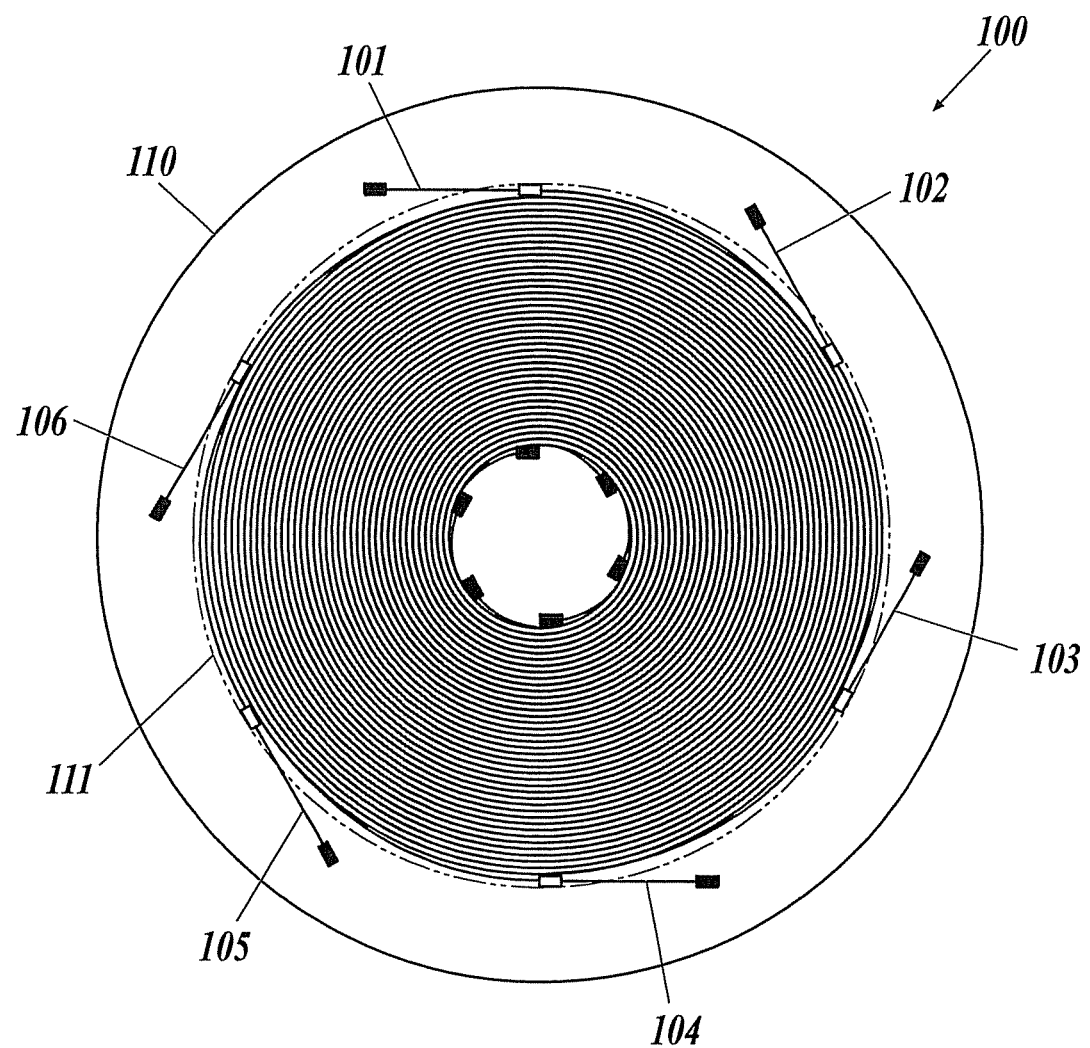
FIG. 15 This is a plan view of an example of a superconducting element unit.

When the superconducting elements have an easily deformable wire shape instead of a strip shape, they may be formed in any shape. For example, two or more superconducting element units 100, each of which includes superconducting elements 101 to 106 formed in a swirly coil shape on the upper surface of a support plate 110 as illustrated in FIG. 15, may be employed, and the units may be stacked in a vertical direction. In the upper surface of the support plate 110, a mesh or a number of slits or small holes is/are formed in an area 111 where the superconducting elements 101 to 106 are disposed in a coil shape so that bubbles can pass through it/them between the front side and the back sides.

In this case, it is desirable that at least one or more superconducting element unit 100 is disposed below a superconducting element unit 100 that includes a superconducting element with the lowest critical current in all of the superconducting elements disposed in the vertically arranged plurality of superconducting element units 100. It is more desirable that the superconducting element unit 100 that includes the superconducting element with the lowest critical current is disposed on the top.

With this configuration, the element life of the superconducting element with the lowest critical current can be extended. Therefore, it is possible to extend the life of the overall device.

The number of superconducting element units may be changed to any number of two or more, and the number of superconducting element in each superconducting element unit 100 may be changed to any number of one or more.

Figure 16:
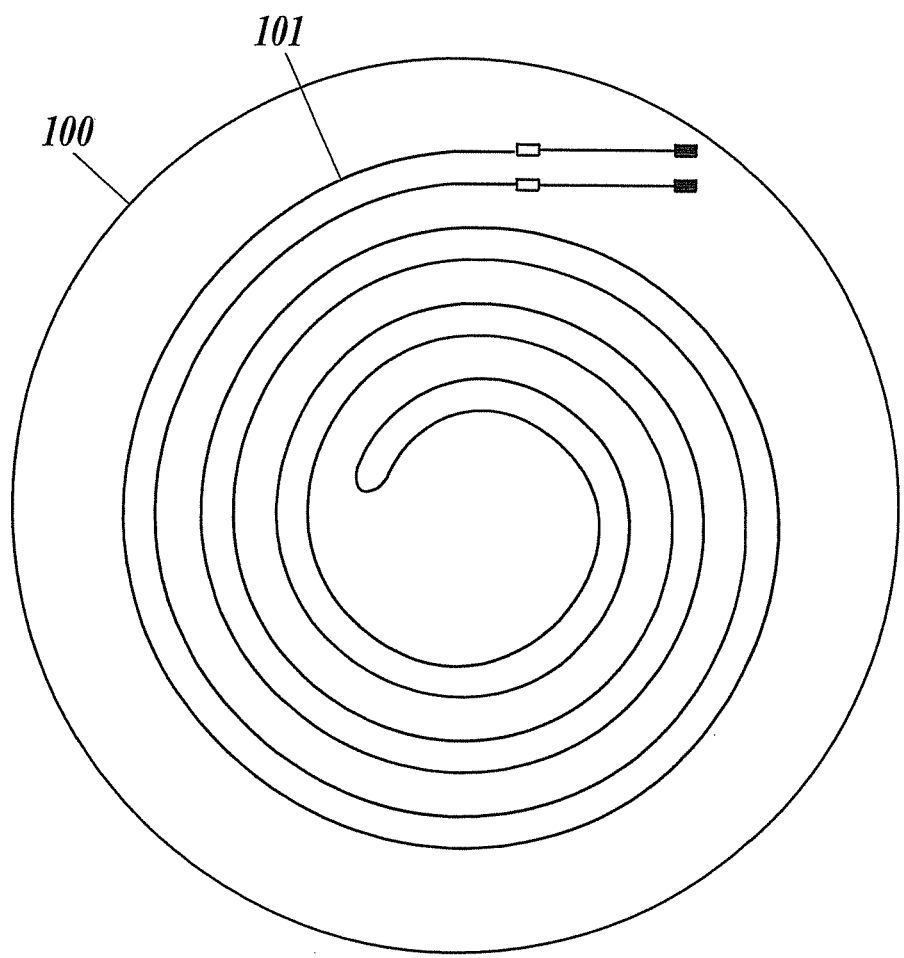
FIG. 16 This is a plan view of another example of a superconducting element unit.

The superconducting element of the superconducting element unit 100 may be formed in a non-inductive coil shape as illustrated in FIG. 16. That is, a wire superconducting element 101 folded in two at the center is wound in a coil shape. When an electric current flows from one end to the other end, the electric current flows in the opposite direction between adjacent parts of the wire superconducting element across the folded center. With this configuration, the inductance of the element group is reduced. Therefore, a voltage generated at a rated current in the superconducting fault current limiter 10 can be reduced.

Also when this non-inductive coil shape is employed, a plurality of wire superconducting elements may be wound in the coil shape as illustrated in FIG. 15.

The above-described critical current values of the superconducting elements 71, 72, 81 to 89 are merely examples and may be changed to any value as long as the above-described conditions of the element arrangement and the critical current are met.

In the above-described embodiment, some of the plurality of superconducting elements are arranged in a horizontal plane. However, the number and the arrangement of the superconducting elements on a plane are not limited to the above-described configuration. It is preferred that the superconducting element with the lowest critical current is disposed in an area where bubbles from the other superconducting elements reach as illustrated in FIG. 9. It is desirable that the plurality of superconducting elements are disposed such that one with a lower critical current is disposed at a higher location. However, at least when one or more other superconducting element is disposed below the superconducting element with the lowest critical current, the life of the superconducting element with the lowest critical current can be extended, and it is thus possible to achieve life extension of the overall device.

Figure 17:
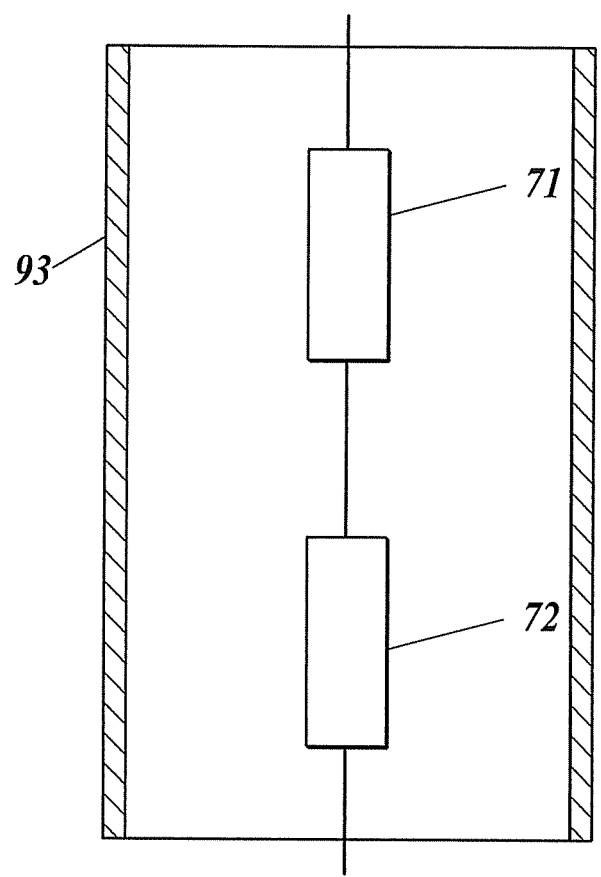
FIG. 17 This is an explanatory view of an example in which an element cover is provided around superconducting elements.

As illustrated in FIG. 17, a cylindrical or frame element cover 93 with open upper and lower ends may be provided in the liquid nitrogen 60 in the coolant vessel 20 to surround the superconducting elements 71, 72, 81 to 89. FIG. 17 illustrates an example in which the superconducting elements 71, 72 are surrounded, and the superconducting elements 81 to 89 may also be fully surrounded by the element cover 93.

The element cover 93 can restrain diffusion of nitrogen gas bubbles that is produced on the lower superconducting element in the event of a fault current so as to lead the bubbles upward to expose the upper superconducting element to the bubbles and the resultant liquid flow more efficiently. Therefore, it is possible to perform more efficient cooling.

An element cover having a different shape other than cylindrical and frame shapes that has open upper and lower ends and is capable of restraining diffusion of nitrogen gas bubbles may be used to surround the superconducting elements 71, 72.

In the above-described example, the superconducting elements have a strip shape. However, they may have any shape such as a bar shape, a wire shape, a sheet shape and the like. Further, the superconductor of the superconducting elements is not limited to that of the above-described example, and the superconducting elements may be made of other superconducting materials. In this case, it is desirable to suitably select a refrigerator and a liquid coolant that are capable of cooling the selected superconducting material to a temperature at which the selected superconducting material can maintain the superconducting state.

Summary of Third Embodiment

Hereinafter, the third embodiment of the present invention will be described based on the drawings.

Figure 18:
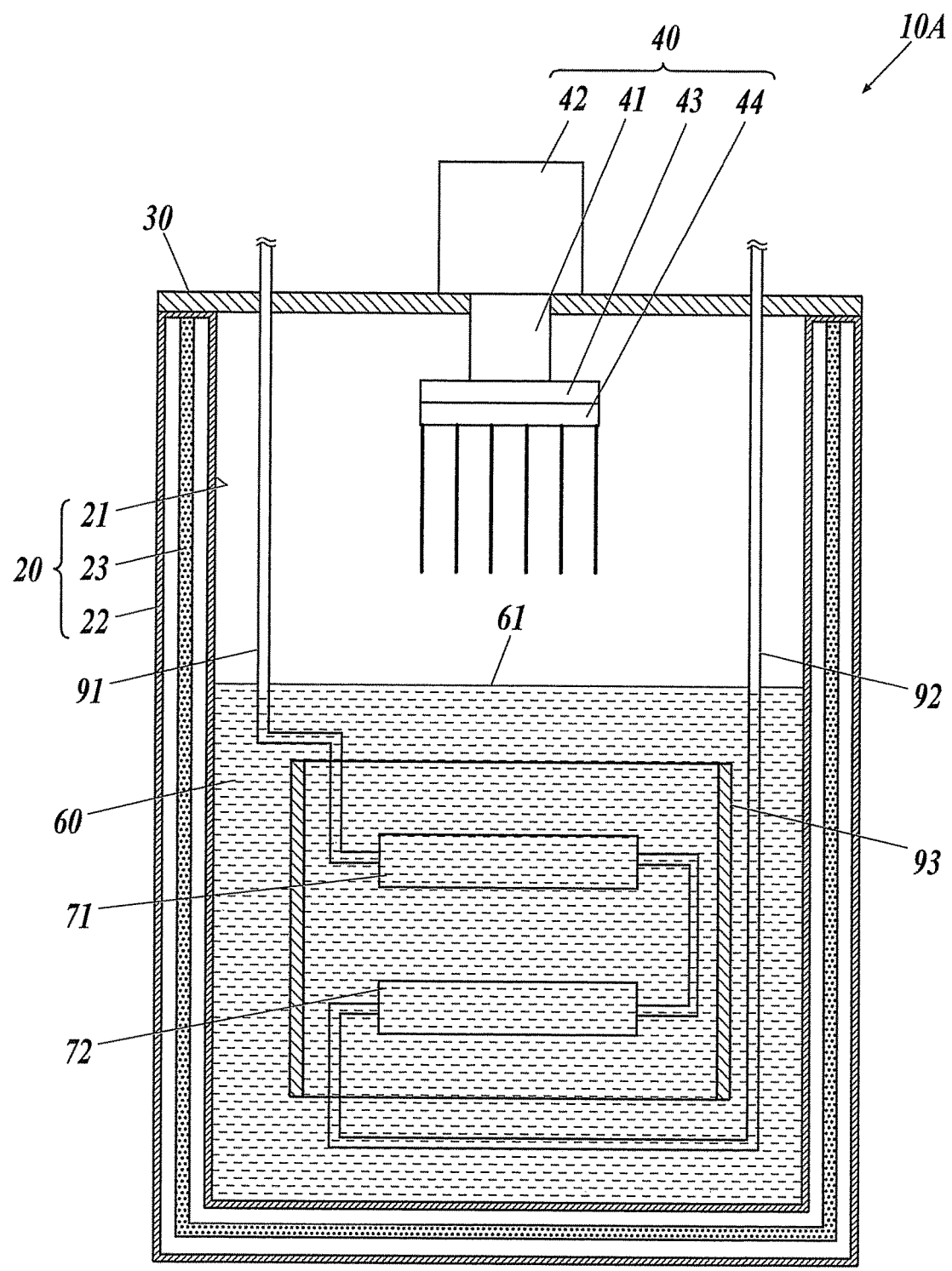
FIG. 18 This is a cross sectional view of a superconducting fault current limiter according to a third embodiment, taken along a vertical plane.

In the third embodiment, a superconducting fault current limiter 10A, which is installed in a power supply path of an externally-powered device to be protected to reduce a fault current that occurs in a power source, and a cooling method for superconducting elements 71, 72 in the superconducting fault current limiter 10A are described. FIG. 18 is a cross sectional view of the superconducting fault current limiter 10A, taken along a vertical plane.

The same reference signs are denoted to the same components of the superconducting fault current limiter 10A as those of the superconducting fault current limiter 10, and repetitive description is omitted.

The superconducting fault current limiter 10A includes a coolant vessel 20, a lid member 30, a refrigerator 40, and an element cover 93 that surrounds two superconducting elements 71, 72 in liquid nitrogen 60 in the coolant vessel 20.

When the current flowing though the superconducting fault current limiter 10A is within the range not exceeding the critical current of both of the two superconducting elements 71, 72, it remains in the superconducting state. In the event a fault current that exceeds the critical current of at least either one of them, it changes to the normal conducting state to have an electric resistance so that the excessive current is prevented from flowing to a device under protection.

Figure 19:
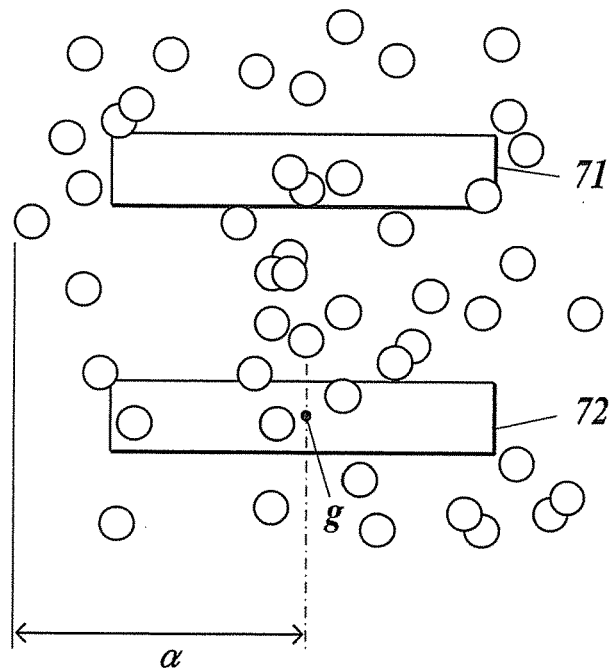
FIG. 19 This is an explanatory view illustrating the principle of cooling by the arrangement of superconducting elements.

As described above, when the superconducting elements 71, 72 are vertically arranged in the coolant vessel 20 as illustrated in FIG. 19, film boiling occurs on the surface of the lower superconducting element 72 and a lot of nitrogen gas bubbles rises therefrom, and the upper superconducting element 71 is exposed to the rising lot of nitrogen gas bubbles and a resultant upward liquid flow.

At this moment, the film boiling nitrogen gas on the surface of the upper superconducting element 71 is removed from the surface by the bubbles and the liquid flow from below, so that the surface of the upper superconducting element 71 is brought in contact with the liquid nitrogen again. Therefore, it becomes possible to perform effective cooling.

The life of a superconducting element is likely to be decreased as the accumulated time exposed to a certain high temperature condition is increased. Therefore, the faster the cooling from a high temperature condition caused by a fault current is, the more the element life can be extended. Accordingly, by vertically arranging the superconducting elements 71, 72 as described above, the life of at least the superconducting element 71 is extended, and the life of the overall superconducting fault current limiter 10A is thereby extended.

Element Cover

Figure 20:
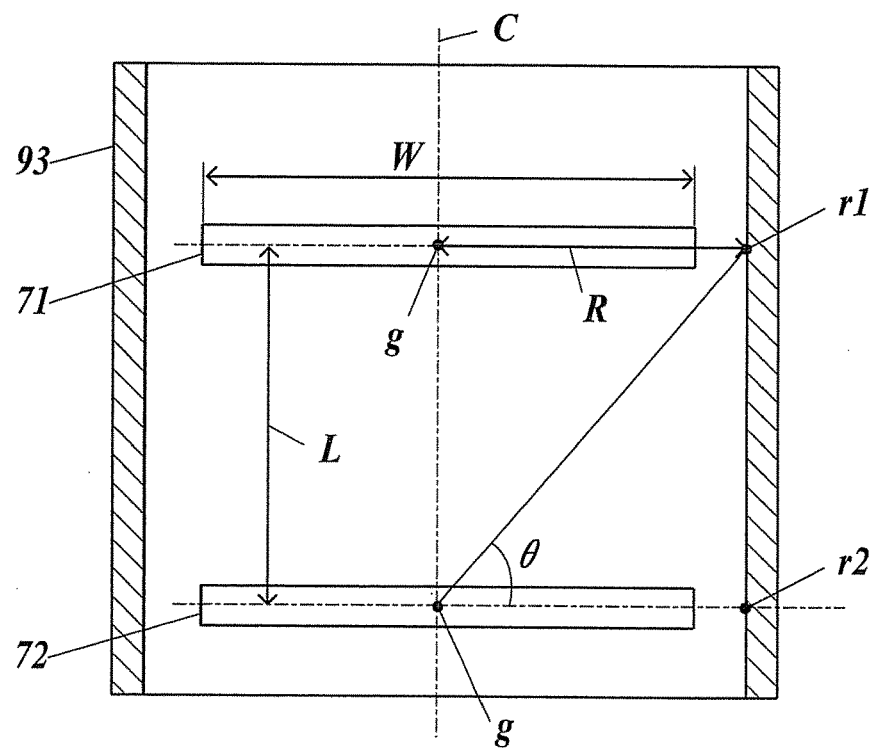
FIG. 20 This is a cross sectional view taken along the center axis in the element cover.
Figure 21:
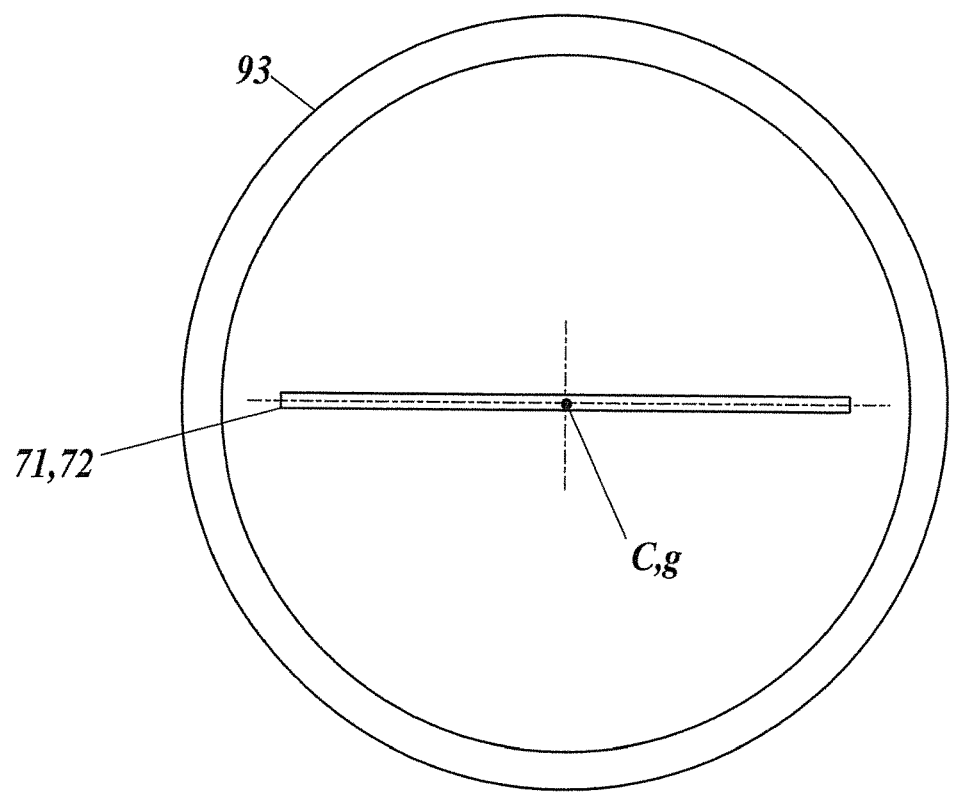
FIG. 21 This is a plan view of an element cover.

FIG. 20 is a cross sectional view of the element cover 93 taken along the center line, and FIG. 21 is a plan view thereof. As illustrated in the figures, the element cover 93, which has a circular shape in a plan view, is a cylinder that is disposed in the coolant vessel such that the center line C is in the vertical direction. The element cover 93 has open upper and lower ends.

In the element cover 93, the two superconducting elements 71, 72 are vertically arranged.

As described above, the superconducting elements 71, 72 are disposed such that one superconducting element 71 is located over the other superconducting element 72. In the event of a fault current, this arrangement allows nitrogen gas bubbles and a resultant liquid flow that are produced by film boiling on the lower superconducting element 72 to be utilized to improve the cooling efficiency of the upper superconducting element 71. When the bubbles and liquid flow from the lower superconducting element 72 are utilized as described above, diffusion of the bubbles decreases the performance of removing the film boiling nitrogen gas on the upper superconducting element 71. This makes it difficult to sufficiently improve the cooling efficiency.

To cope with the problem, the superconducting elements 71, 72 are surrounded by the element cover 93 so that the bubbles from the lower superconducting element 72 are prevented from diffusion. This allows effectively leading the bubbles and liquid flow to the upper superconducting element 71.

The arrangement of the superconducting elements 71, 72 relative to the element cover 93 will be described.

In the following description, the centers g of the superconducting elements 71, 72 refer to the midpoints of the superconducting elements 71, 72 in the longitudinal direction in a plan view as well as in the transverse direction in a plan view and in the vertical direction. The centers g are coincide with the centers of gravity of the superconducting elements 71, 72 when they have a rectangular plate (cuboid) shape and a uniform density.

The superconducting elements 71, 72 are disposed such that the centers g, g are both on the center line C of the element cover 93.

The superconducting elements 71, 72 are disposed such that the following expression (3) is satisfied, where L is the inter-center distance between the centers g, g of the two superconducting elements 71, 72 in the vertical direction, R is the distance from the centers g of the superconducting elements 71, 72 to the inner surface of the element cover 93 in the longitudinal direction of the superconducting elements 71, 72, W is the length of the superconducting elements 71, 72 in the longitudinal direction in a plan view, r1 is the intersection of the line extending from the center g of one superconducting element 71 in the longitudinal direction of the superconducting element 71 with the inner surface of the element cover 93, r2 is the intersection of the line extending from the center g of the other superconducting element 72 in the longitudinal direction of the superconducting element 72 with the inner surface of the element cover 93, and θ is the intersecting angle between the line connecting the center g of the other superconducting element 72 and the intersection r1 and the line connecting the center g of the other superconducting element 72 and the intersection r2.

$$\tan^{-1}(L/R) \leq 70° \quad (3)$$

Since $\tan^{-1}(L/R)=\theta$, the above expression (3) is equivalent to $\theta \leq 70°$.

Since it is desirable that bubbles can pass though the gaps between the longitudinal ends of the superconducting elements 71, 72 and the inner surface of the element cover 93, R is set to R>W/2 so that the gaps are not completely closed.

The distance α from the center g which the bubbles reach when the current flowing through the superconducting elements 71, 72 exceeds the critical current is generally within a certain range (see FIG. 19). Therefore, the distance R is desirably equal to or less than α (R≤α).

The lower superconducting element 72 is disposed such that the lower end thereof is located higher than the lower end of the element cover 93. With this configuration, bubbles produced by film boiling are not leaked out of the element cover 93 and can be effectively led upward.

Improvement of Cooling Efficiency by Utilizing Bubbles of Film Boiling

Figure 22:
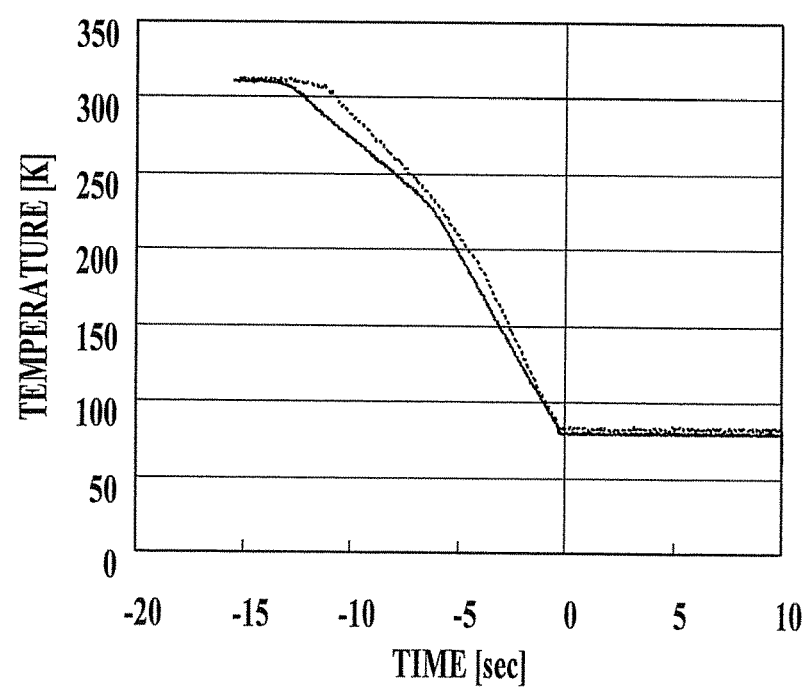
FIG. 22 This is a graph illustrating the relationship between presence or absence of bubbles from below and temperature change during cooling.

The improvement of cooling efficiency by utilizing bubbles of film boiling will be described. In FIG. 22, the solid line represents the time required to cool the sole superconducting element 71 to a coolant temperature (77 [K]) when the superconducting element 71 at room temperature (303 [K]) is put into the liquid nitrogen in the coolant vessel 20, and the temperature change during the process. Further, in FIG. 22, the dashed line represents the time required to cool the sole superconducting element 71 to a coolant temperature (77 [K]) when the superconducting element 71 at room temperature (303 [K]) and a metal frame at room temperature that serves as a source of film boiling bubbles are disposed in the coolant vessel 20, and the temperature change during the process. The frame was disposed obliquely below the superconducting element 71 on the line tilted by 70° with respect to the vertical line extending from the center g.

In both cases, the superconducting element 72 and the element cover 93 were previously removed from the coolant vessel 20.

As illustrated in FIG. 22, when only the superconducting element 71 was disposed (solid line), the time required to cool it to the coolant temperature was approximately 13 [s]. When the frame was disposed obliquely below the superconducting element 71 (dashed line), the time required to cool it to the coolant temperature was approximately 11 [s].

When the frame is provided, film boiling occurs on the surface of the frame that is at a higher temperature than the liquid coolant, and a lot of nitrogen gas bubbles rise along with a liquid flow. Then, the superconducting element 71 in film boiling is exposed to the bubbles and the liquid flow from the frame. Then, low-cooling efficiency nitrogen gas is thereby removed from the surface, and the superconducting element 71 is cooled by liquid nitrogen. In this way, the cooling efficiency is improved.

By disposing a film boiling bubble source below, the nitrogen gas bubbles and the liquid flow therefrom improve the cooling efficiency of a superconducting element in film boiling.

Accordingly, by disposing one superconducting element 71 over the other superconducting element 72 as in the superconducting fault current limiter 10A as illustrated in FIG. 18, the lower superconducting element serves as a bubble source when a fault current exceeding the critical current flows. Therefore, even when film boiling occurs on the upper superconducting element 71, it is possible to perform faster cooling.

Cooling Improvement by Element Cover

FIG. 23 shows the result of comparison in recovery time to the coolant temperature after an electric current was applied to the superconducting elements 71, 72 to heat them between conditions with and without the element cover 93 provided in the coolant vessel 20. In FIG. 23, the comparison is made in the amount of heat generated and the recovery time when an electric current is applied to the superconducting elements 71, 72 to heat them. In all conditions, the superconducting elements 71, 72 were disposed in the coolant vessel 20 as illustrated in FIG. 20 in which the intersecting angle was set to 30°.

In FIG. 23, the symbol "♦" represents the condition with the element cover, and the symbol "□" represents the condition without the element cover. Compared to the condition without the element cover 93, the recovery time is decreased in the condition with the element cover 93. The greater the amount of heat generated, the larger the difference in recovery time. For example, when a charging voltage of 1000 [V] is applied, the recovery time was 3.7 [sec] in the condition without the element cover 93. In contrast, the recovery time was 3.1 [sec] in the condition with the element cover 93, which was reduced by approximately 20%.

While the amount of nitrogen gas bubbles produced on the lower superconducting element 72 is increased with an increase of the amount of heat generated, it is found that that the element cover 93 effectively leads the bubbles to the upper superconducting element 71 so as to improve the cooling efficiency.

Cooling Improvement by Vertical Arrangement of Superconducting Elements Relative to Element Cover FIG. 24 shows a list of the recovery time of the superconducting element 71 from a heated state in a condition without the element cover and in conditions of an intersecting angle θ regarding the vertical arrangement of the superconducting elements 71, 72 with respect to the element cover 93 of 20°, 25°, 30°, 45°, 60°, 70°, 75° and 80°. In the comparison of FIG. 24, the distance R from the centers of the superconducting elements to the element cover is set to a constant value while only the inter-center distance L between the two superconducting elements 71, 72 is changed to change the intersecting angle θ. The other arrangement configurations are the same as the example of FIG. 20. In the comparison, the amount of heat generated in each of the superconducting elements 71, 72 were set to 400 [J].

As a result of the comparison, it was found that the recovery times in the conditions of an intersecting angle of 75° or more was not so different from the recovery time in the condition without the element cover 93, but the recovery times in the conditions of an intersecting angle within the range of θ≤70° were remarkably reduced.

That is, it is found that an advantageous effect is obtained when $\tan^{-1}(L/R) \leq 70°$ is satisfied, but the cooling efficiency is decreased when the angle is greater than 70°.

Inter-Element Distance Between Superconducting Elements and Influence on Mutual Inductance Next, the inter-element distance between the superconducting elements and the influence on the mutual inductance will be described. FIG. 25 is a graph illustrating the relationship between the inter-element distance and the mutual inductance, which is calculated based on a simulation, where the solid line is the result when the flat plate surfaces of the superconducting elements 71, 72 are parallel to the vertical direction (the arrangement of FIG. 20), and the dashed line is the result when the flat plate surfaces of the superconducting elements 71, 72 are both parallel to the horizontal plane. As used herein, the inter-element distance refers to the distance from the upper end surface of the lower superconducting element 72 to the lower end surface of the upper superconducting element 71.

The superconducting elements 71, 72 had a size of 210×30×1 (width in the horizontal direction×width in the vertical direction×width in the thickness direction of paper in the arrangement of FIG. 20, all in [mm]). As illustrated in the figure, when the inter-element distance between the superconducting element 71, 72 is less than approximately 20 [mm], the mutual inductance is drastically increased. Accordingly, it is desirable that inter-element distance between the superconducting elements 71, 72 is equal to or more than 20 [mm].

When the flat plate surfaces of the two superconducting elements 71, 72 are both parallel to the vertical direction (the orientation and location are the same as those of FIG. 20), the inter-center distance L between the two superconducting elements 71, 72 is equal to the sum of the above-described inter-element distance which is determined considering the mutual inductance (20 [mm])+the width of the elements in the vertical direction (30 [mm]). Accordingly, it is desirably L≥50 [mm].

When one end of each of the superconducting elements 71, 72 is disposed close to the inner surface of the element cover 93, the distance R from the centers g of the superconducting elements 71, 72 to the inner surface of the element cover 93 becomes R=210/2=105 [mm].

Substituting the above-described values of L and R for the $\tan^{-1}(L/R)$ of expression (3) yields $\tan^{-1}(L/R)=\tan^{-1}(50/105)=\tan^{-1}(0.48)\approx 25°$ Therefore, it is desirable to satisfy $\tan^{-1}(L/R) \geq 25°$ (θ≥25°) in order to avoid a deteriorated mutual inductance.

As described above, it is desirable that the lower limit of θ $(=\tan^{-1}(L/R))$ is set within the range in which a deteriorated mutual inductance between the superconducting elements 71, 72 can be avoided. For example, the lower limit of θ $(=\tan^{-1}(L/R))$ may be determined based on the value of the inter-element distance at which the change rate of the mutual inductance becomes remarkable as described above. Alternatively, the lower limit of θ $(=\tan^{-1}(L/R))$ may be determined based on a set upper limit value of the mutual inductance.

Figure 26:
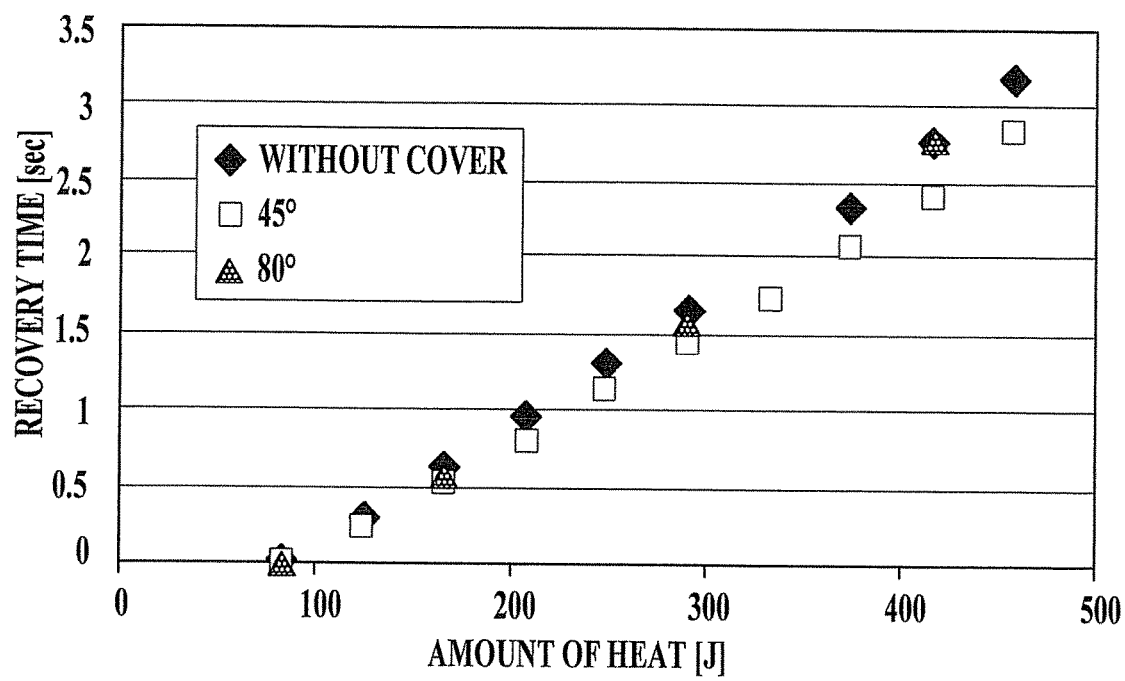
FIG. 26 This illustrates the result of comparison in recovery time of superconducting elements from a heated state between cases when an intersecting angle is 45°, an intersecting angle is 80° and an element cover is not provided.

Cooling Improvement by Vertical Arrangement of Superconducting Elements in Element Cover in Different Amount of Heat Generated FIG. 26 shows the result of comparison in recovery time when the amount of heat generated by applying an electric current to the superconducting element 71 is changed within the range of 0 to 480 [J] between a condition of an intersecting angle of 45°, which is within the suitable range determined by the comparison of FIG. 24, a condition of an intersecting angle of 80°, which is out of the suitable range, and a condition without the element cover 93.

In FIG. 26, the symbol "♦" represents the condition without the element cover, the symbol "□" represents the condition of an intersecting angle of 45° (with the element cover), and the symbol "Δ" (patterned in FIG. 26) represents the condition of an intersecting angle of 80° (with the element cover).

As a result of the comparison, it is found that the recovery time in the condition of an intersecting angle of 45° is reduced more remarkably compared to that in the condition without the element cover 93 as the amount of heat generated is increased. It is also found that the recovery time in the condition of an intersecting angle of 80° is not so different from that in the condition without the element cover 93 even when the charging voltage changes.

Technical Effects of Embodiments of Present Invention

As described above, the superconducting fault current limiter 10A is configured such that one superconducting element 71 is disposed over the other superconducting element 72 in the liquid nitrogen 60 in the coolant vessel 20. In the event of a fault current, this arrangement allows utilizing nitrogen gas bubbles and a resultant liquid flow that are produced by the lower superconducting element 72 in order to improve the cooling efficiency of the upper superconducting element 71 in film boiling. This improvement of the cooling efficiency by the vertical arrangement of the superconducting elements 71, 72 is also confirmed by the result of FIG. 22 in which the cooling efficiency was improved when a film boiling nitrogen gas source is provided.

Furthermore, the superconducting fault current limiter 10A includes the element cover 93 that surrounds the two superconducting elements 71, 72. With this configuration, bubbles produced on the lower superconducting element 72 are efficiently led to the upper superconducting element 71. Therefore, the improvement of the cooling efficiency is achieved. This improvement of the cooling efficiency by the element cover 93 is also confirmed by the result of the comparative test of FIG. 23 in which the recovery time to the cooling temperature is compared between conditions with and without the element cover 93.

The two superconducting elements 71, 72 are arranged in the element cover such that the distance R from the centers g, g to the inner surface of the element cover 93 and the inter-center distance L between the two superconducting elements 71, 72 satisfy $\tan^{-1}(L/R) \leq 70°$. With this configuration, improvement of the cooling efficiency of the upper superconducting element 71 can be achieved. This improvement of the cooling efficiency by the arrangement of the superconducting elements is also confirmed by the result of the comparative test of FIG. 24 and FIG. 26 in which the intersecting angle θ, which is determined by L and R, is changed.

Furthermore, as illustrated in FIG. 25, the inter-element distance of the superconducting elements 71, 72 is set to 20 [mm] or more. With this configuration, the influence of the mutual inductance of the superconducting elements 71, 72 can be reduced. To satisfy this condition and the like, it is desirable that the intersecting angle θ, which is determined based on the arrangement of the superconducting elements 71, 72, is within the range of 25° or more.

That is, setting θ to satisfy $25° \leq \tan^{-1}(L/R) \leq 70°$ enables improving the cooling efficiency while reducing the influence of the mutual inductance of the superconducting elements 71, 72.

The lower superconducting element 72 in the element cover 93 is disposed such that the lower end thereof is located higher than the lower end of element cover 93. With this configuration, in the event of a fault current, nitrogen gas bubbles from the superconducting element 72 can be led toward the superconducting element 71 without a leak of the bubbles out of the element cover 93. Therefore, it becomes possible to perform further effective cooling of the superconducting element 71.

As described above, in the superconducting fault current limiter 10A, the element cover 93 is provided in the coolant vessel 20, and the superconducting elements 71, 72 are arranged relative to the element cover such that the above-described arrangement conditions are satisfied. With this configuration, the upper superconducting element 71 can be effectively cooled so that the life thereof can be extended. Therefore, it becomes possible to achieve life extension of the superconducting fault current limiter 10A.

Since the improvement of the cooling efficiency is achieved by the element cover 93 and the arrangement of the superconducting elements 71, 72 relative to the element cover 93, it is not required to add a special structure or configuration for cooling to the coolant vessel 20. This allows simplification of the overall superconducting fault current limiter 10A and a cost reduction.

Figure 27:
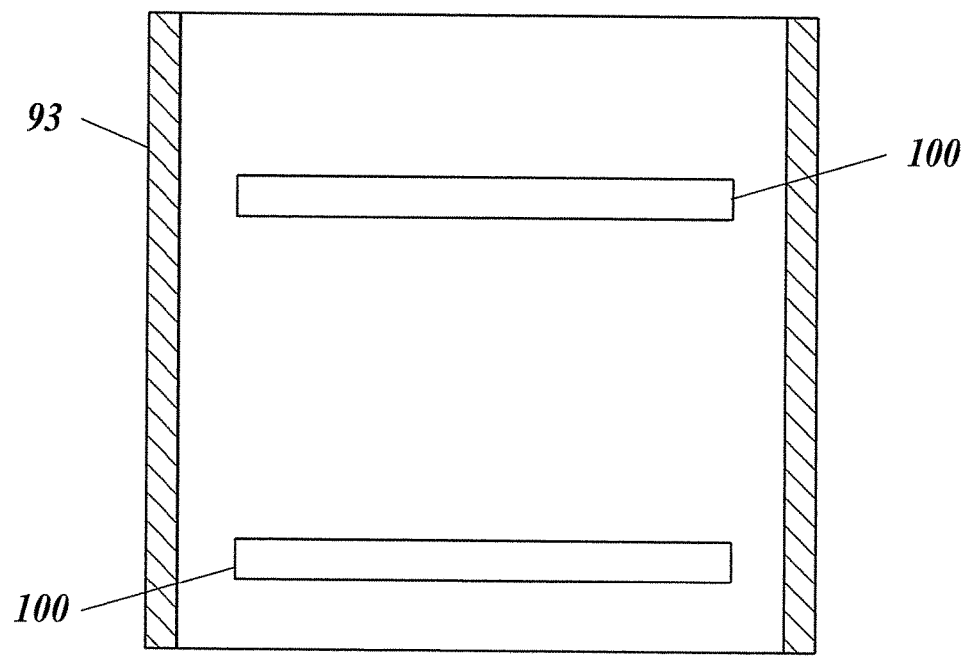
FIG. 27 This is a cross sectional view of an example in which the superconducting element unit of FIG. 15 is disposed in an element cover.
Figure 28:
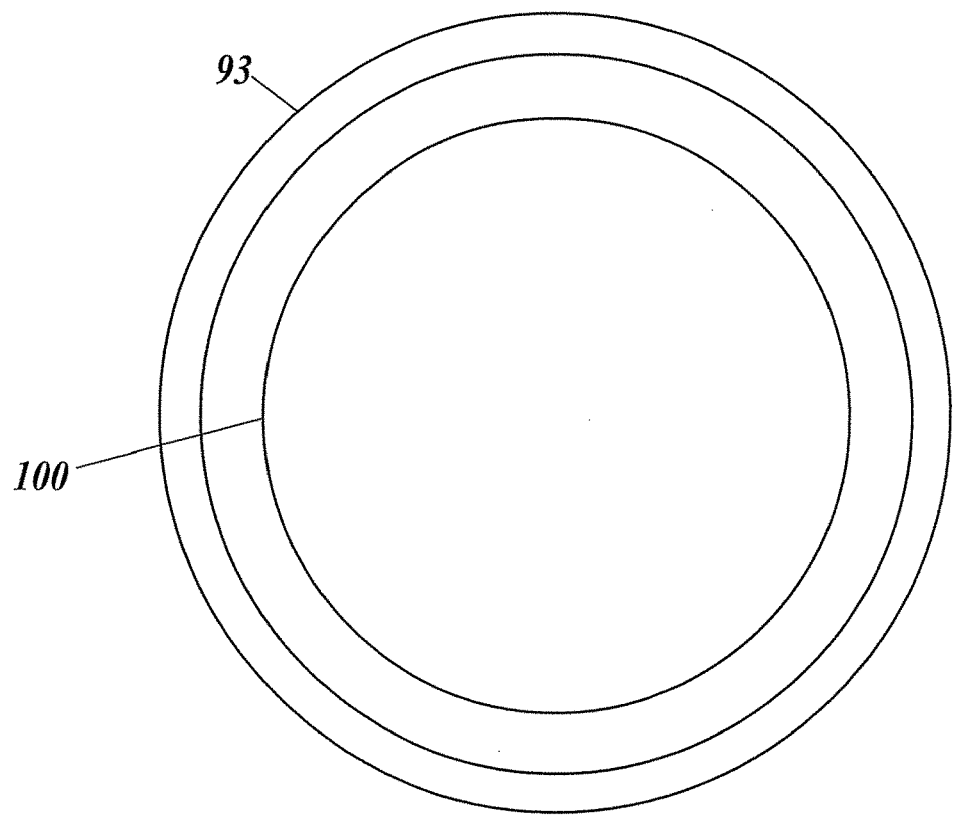
FIG. 28 This is a plan view of an example in which the superconducting element unit of FIG. 15 is disposed in an element cover.

As illustrated in FIG. 27 and FIG. 28, a plurality of the above-described superconducting element units 100 (see FIG. 15) may be provided, which may be vertically arranged in the element cover 93. In this case, it is desirable that the superconducting element units 100 are all parallel to a horizontal plane.

Further, among the vertically arranged plurality of superconducting element units 100, it is desirable that at least one superconducting element unit 100 is disposed below a superconducting element unit 100 that includes a superconducting element with the lowest critical current. It is more desirable that the superconducting element unit 100 including the superconducting element with the lowest critical current is disposed on the top.

Even when the superconducting element with the lowest critical current is located on the bottom, the improvement of the cooling efficiency by the element cover 93 can be achieved as long as the plurality of superconducting elements are vertically arranged.

Others

Figure 29:
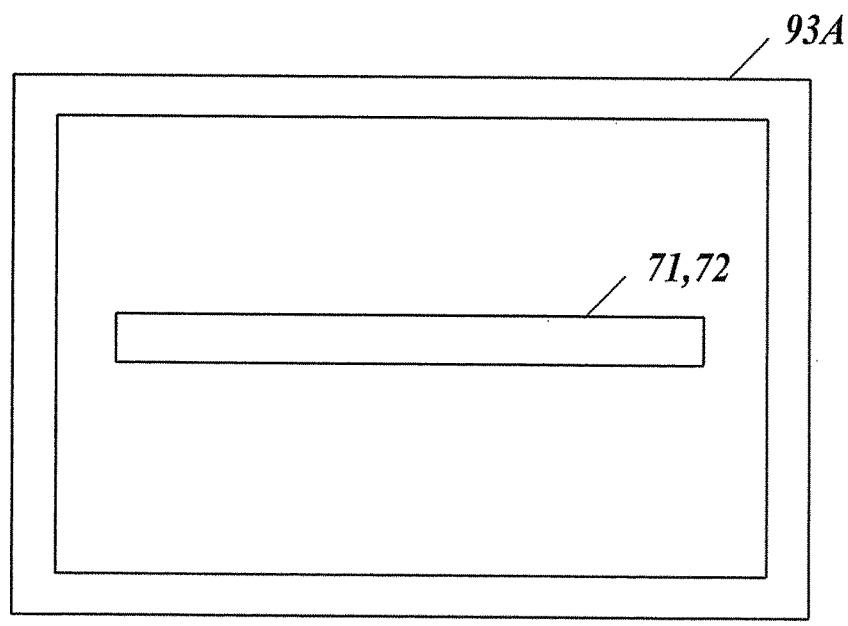
FIG. 29 This is a plan view of an example in which an element cover has a rectangular shape in a plan view.

The shape of the above-described element cover 93 is not limited to a cylindrical shape, and it may be a tube or frame with any shape in a plan view that has open upper and lower ends. For example, as illustrated in FIG. 29, an element cover 93A, which is a frame with a rectangular shape in a plan view, may also be used. Further, the element cover may also be formed in a polygonal, ellipse or oval shape. It is desirable that the element cover has a uniform cross section over the whole length in the vertical direction so that a through hole is formed over the whole length.

Also when the element cover 93A is a rectangular frame, it is desirable that the superconducting elements 71, 72 are disposed such that the expression $\tan^{-1}(L/R) \leq 70°$ is satisfied in the longitudinal direction. Considering the influence of the mutual inductance, it is more preferred that the expression $25° \leq \tan^{-1}(L/R) \leq 70°$ is satisfied.

The superconducting elements 71, 72 may be surrounded by a cover with a different shape other than a tube or frame shape as long as it has open upper and lower ends and is capable of restraining diffusion of nitrogen gas bubbles.

In the examples, the superconducting elements have a strip shape. However, the shape is not limited thereto, and they may have any shape such as bar, wire and sheet shapes. Some shapes of the superconducting elements may have no specific longitudinal direction in a plan view (e.g. a circular shape in a plan view). In such cases, any certain direction may be set as the longitudinal direction to define the distance R from the centers of the superconducting elements to the inner surface of the element cover in the set longitudinal direction, and the superconducting elements may be disposed such that the expression (3) is satisfied.

The position and orientation of the above-described superconducting elements 71, 72 may be changed.

For example, in the examples, the superconducting elements 71, 72 are disposed such that their longitudinal direction is in the horizontal direction. However, they may be disposed such that their longitudinal direction is in the vertical direction.

In the examples, the superconducting elements 71, 72 are disposed such that their flat plate surfaces are parallel to the vertical direction. However, they may be disposed such that their flat plane surfaces are parallel to the horizontal direction.

The number of superconducting elements is not limited to two, and a larger number of superconducting elements may be used. In this case, the superconducting elements may be all connected in series, or they may be connected by a combination of serial and parallel connections. When a larger number of superconducting elements are used, they may be arranged in multiple tiers instead of the upper and lower two tiers. In this case, it is desirable that at least one pair of vertically adjacent two superconducting elements are disposed such that the expression (3) is satisfied. It is more desirable that all pairs of vertically adjacent two superconducting elements are disposed such that the expression (3) is satisfied.

Figure 30:
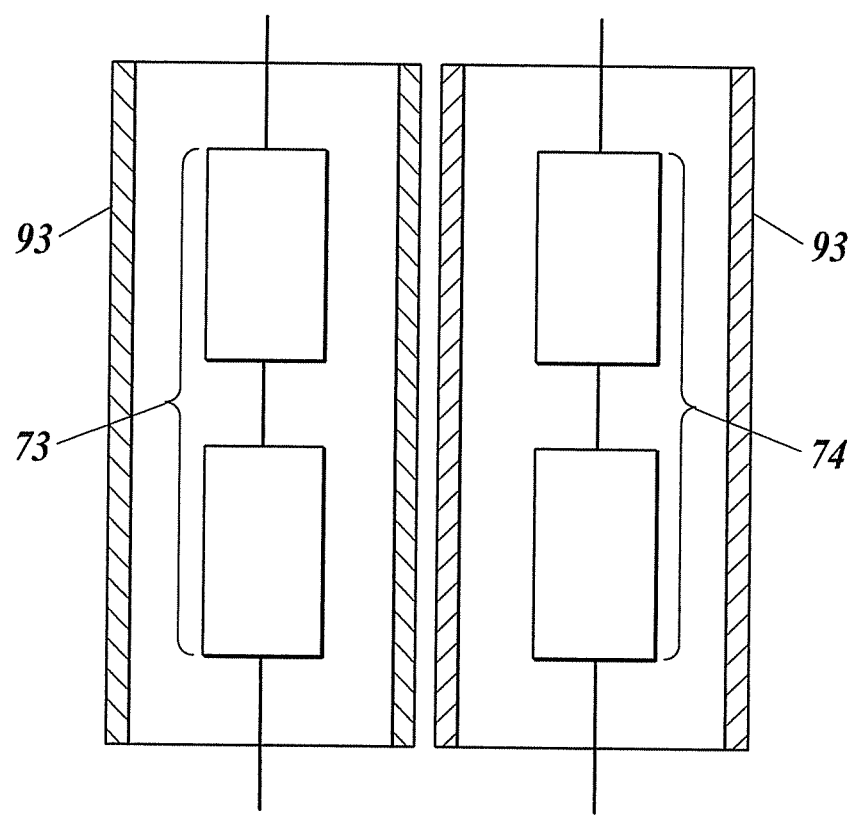
FIG. 30 This is an explanatory view of an example in which element covers are provided to respective sets of superconducting elements.

When the superconducting fault current limiter includes a plurality of sets 73, 74 each composed of vertically arranged superconducting elements as illustrated in FIG. 30, the element covers 93, 93 may be provided for the respective sets 73, 74 of the superconducting elements so that the sets are individually disposed therein. Alternatively, when the superconducting fault current limiter includes a plurality of sets 73, 74 each composed of vertically arranged superconducting elements, they may be disposed in a single element cover.

When vertically adjacent two superconducting elements have a different critical current from each other, in which they can be maintained in the superconducting state, the superconducting element with a lower critical current is likely to have a shorter life. Therefore, it is desirable to dispose the superconducting element with a lower critical current at a higher location. By improving the cooling efficiency of the superconducting element with a shorter life and thereby extending its life, it becomes possible to achieve life extension of the superconducting fault current limiter more effectively.

When both longitudinal ends of the superconducting elements are located at the same distance from the inner surface of the element cover (the centers g are located on the center line C), it is desirable that the above-described expression (3) is satisfied in both ends in the longitudinal direction.

When the longitudinal ends of the superconducting elements are located at the different distances from the inner surface of the element cover, it is desirable that the above-described expression (3) is satisfied in the end closer to the inner surface of the element cover.

INDUSTRIAL APPLICABILITY

The present invention, which is a device or a method used in a power system and the like, is applicable to preventing a short-circuit and the like.

DESCRIPTION OF REFERENCE NUMERALS 10, 10A superconducting fault current limiter
20 coolant vessel
30 lid member
40 refrigerator (cooling means)
60 liquid nitrogen (liquid coolant)
71, 72, 81 to 89 superconducting element
93, 93A element cover

The invention claimed is:

1. A superconducting fault current limiter comprising superconducting elements which are in a superconducting state when an electric current flows within a range of electric current values and which change to a normal conducting state when a fault current flows exceeding the range, comprising:
   a coolant vessel which accommodates a liquid coolant and the superconducting elements; and
   a cooling means which cools the liquid coolant in the coolant vessel, wherein among the superconducting elements, a first superconducting element with a lowest critical current is disposed over a second superconducting element in the liquid coolant and wherein vaporized gas bubbles from the second superconducting element assist vaporized gas, on a surface of the first superconducting element, to be released.

2. The superconducting fault current limiter according to claim 1, wherein the superconducting elements are disposed in the liquid coolant such that a superconducting element with a lower critical current is located at a higher location in the liquid coolant than another superconducting element with a higher critical current than the lower critical current of the superconducting element.

3. The superconducting fault current limiter according to claim 1, wherein the superconducting elements are arranged in a plane parallel to a vertical direction, and wherein each pair of vertically adjacent two superconducting elements is disposed such that an upper superconducting element has a lower critical current than a lower superconducting element.

4. The superconducting fault current limiter according to claim 3, wherein a plurality of sets, each composed of the superconducting elements arranged in the plane parallel to the vertical direction, is arranged such that the superconducting elements are disposed three-dimensionally as a whole.

5. The superconducting fault current limiter according to claim 1, further comprising an element cover which has open upper and lower ends and which is disposed in the coolant vessel surrounding the superconducting elements.

6. A superconducting fault current limiter comprising a plurality of superconducting elements which are in a superconducting state when an electric current flows within a certain range of electric current values and which change to a normal conducting state when a fault current flows exceeding the certain range, comprising:
   a coolant vessel which accommodates a liquid coolant and the plurality of superconducting elements; and
   a cooling means which cools the liquid coolant in the coolant vessel, wherein at least two superconducting elements of the plurality of superconducting elements are vertically arranged in the liquid coolant, such that vaporized gas bubbles from a lower element of the at least two superconducting elements assists a release of vaporized gas on a surface of a higher element of the at least two superconducting elements, and wherein the superconducting fault current limiter further comprises an element cover which has open upper and lower ends and which surrounds the at least two superconducting elements.

7. The superconducting fault current limiter according to claim 6, wherein a lower superconducting element of the at least two superconducting elements surrounded by the element cover is disposed such that a lower end of the lower superconducting element is located higher than a lower end of the element cover.

8. The superconducting fault current limiter according to claim 6,
   wherein the at least two superconducting elements are disposed such that the following expression (I) is satisfied, $$\tan^{-1}(L/R) \leq 70° \tag{I}$$

where R is a distance from centers of the at least two superconducting elements to an inner surface of the element cover in a longitudinal direction in a plan view of the at least two superconducting elements, and L is an inter-center distance between the at least two superconducting elements in a vertical direction of the at least two superconducting elements.

9. A cooling method for superconducting elements in a superconducting fault current limiter which comprises the superconducting elements which are in a superconducting state when an electric current flows within a certain range of electric current values and which change to a normal conducting state when a fault current flows exceeding the certain range, comprising:
   disposing the superconducting elements such that a superconducting element with a lowest critical current is located over another superconducting element in a liquid coolant in a coolant vessel; and
   cooling the superconducting element with the lowest critical current by using bubbles which are produced on the other superconducting element disposed below the superconducting element with the lowest critical current.

10. The cooling method for the superconducting elements in the superconducting fault current limiter according to claim 9, wherein the superconducting element with the lowest critical current is cooled when the liquid coolant is in a film boiling state on a surface of the superconducting element with the lowest critical current.

11. The cooling method for the superconducting elements in the superconducting fault current limiter according to claim 9, wherein the superconducting elements are disposed in the liquid coolant such that a first superconducting element with a lower critical current than a second super conducting element with a higher critical current is at a higher location than the second super conducting element.

12. The cooling method for the superconducting elements in the superconducting fault current limiter according to claim 9, wherein the superconducting elements are arranged in a plane parallel to a vertical direction, and wherein the superconducting elements are disposed such that an upper superconducting element of each pair of vertically adjacent two superconducting elements has a lower critical current than a lower superconducting element.

13. The cooling method for the superconducting elements in the superconducting fault current limiter according to claim 12, wherein a plurality of sets, each composed of the superconducting elements arranged in the plane parallel to the vertical direction, are disposed so that the superconducting elements are disposed three-dimensionally as a whole.

14. The cooling method for the superconducting elements in the superconducting fault current limiter according to claim 9, wherein the superconducting elements are disposed in an element cover which has open upper and lower ends and which is disposed in the coolant vessel.

15. A cooling method for a plurality of superconducting elements in a superconducting fault current limiter which comprises the plurality of superconducting elements which are in a superconducting state when an electric current flows within a range of electric current values and which change to a normal conducting state when a fault current flows exceeding the range, comprising:
    disposing vertically at least two of the plurality of superconducting elements in an element cover which has open upper and lower ends and which is disposed in a liquid coolant in a coolant vessel, resulting in at least two vertically arranged superconducting elements; and
    leading bubbles produced on a lower superconducting element of the plurality of superconducting elements toward an upper superconducting element of the plurality of superconducting elements.

16. The cooling method for the plurality of superconducting elements in the superconducting fault current limiter according to claim 15, wherein the upper superconducting element has a lowest critical current of the plurality of superconducting elements and is cooled when the liquid coolant is in a film boiling state on a surface of the upper superconducting element.

17. The cooling method for the plurality of superconducting elements in the superconducting fault current limiter according to claim 15, wherein the lower superconducting element of the at least two vertically arranged superconducting elements is disposed such that a lower end of the lower superconducting element is located higher than a lower end of the element cover.

18. The cooling method for the plurality of superconducting elements in the superconducting fault current limiter according to claim 15, wherein the at least two vertically arranged superconducting elements are disposed such that the following expression (I) is satisfied, $$\tan^{-1}(L/R) \leq 70° \qquad (I)$$

where R is a distance from centers of the at least two vertically arranged superconducting elements to an inner surface of the element cover in a longitudinal direction in a plan view of the at least two vertically arranged superconducting elements, and L is an inter-center distance between the at least two vertically arranged superconducting elements in the vertical direction of the at least two vertically arranged superconducting elements.

* * * * *